(12) United States Patent
Washio et al.

(10) Patent No.: US 11,127,926 B2
(45) Date of Patent: Sep. 21, 2021

(54) METHOD OF FORMING PROTECTION FILM FOR ORGANIC EL DEVICE, METHOD OF MANUFACTURING DISPLAY DEVICE AND DISPLAY DEVICE

(71) Applicant: THE JAPAN STEEL WORKS, LTD., Tokyo (JP)

(72) Inventors: Keisuke Washio, Kanagawa (JP); Tatsuya Matsumoto, Kanagawa (JP); Junichi Shida, Kanagawa (JP); Takashi Ebisawa, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 81 days.

(21) Appl. No.: 15/361,444

(22) Filed: Nov. 27, 2016

(65) Prior Publication Data

US 2018/0053915 A1     Feb. 22, 2018

(30) Foreign Application Priority Data

Aug. 16, 2016   (JP) .............................. JP2016-159659

(51) Int. Cl.
*H01L 35/24* (2006.01)
*H01L 21/00* (2006.01)
(Continued)

(52) U.S. Cl.
CPC ...... *H01L 51/5256* (2013.01); *H01L 51/0097* (2013.01); *H01L 51/56* (2013.01)

(58) Field of Classification Search
CPC . H01L 51/0097; H01L 51/56; H01L 51/5256; H01L 25/047; H01L 27/30;
(Continued)

(56) References Cited

U.S. PATENT DOCUMENTS 6,489,638 B2 * 12/2002 Seo ...................... H01L 51/0077
257/98
8,945,724 B2 * 2/2015 Yamamoto ........... C07D 235/08
257/40

(Continued)

FOREIGN PATENT DOCUMENTS

JP    2001-284042 A    10/2001
JP    2006-278486 A    10/2006
(Continued)

OTHER PUBLICATIONS

Office Action dated Feb. 22, 2018, in Taiwanese Patent Application No. 105126828.

(Continued)

*Primary Examiner* — Kimberly N Rizkallah
*Assistant Examiner* — Dilinh P Nguyen
(74) *Attorney, Agent, or Firm* — SGPatents PLLC

(57) ABSTRACT

A method of manufacturing a display device having an organic EL device includes the steps of: forming an organic EL device over a substrate; and forming a protection film so as to cover the organic EL device. The protection film is made of a laminated film of a first insulating film containing Si, a second insulating film containing Al and a third insulating film containing Si. The step of forming the protection film includes the steps of: forming the first insulating film by a plasma CVD method so as to cover the organic EL device; forming the second insulating film over the first insulating film by an ALD method; and forming the third insulating film over the second insulating film by a plasma CVD method.

20 Claims, 13 Drawing Sheets

(51) Int. Cl.
    *H01L 51/40*     (2006.01)
    *H01L 51/52*     (2006.01)
    *H01L 51/56*     (2006.01)
    *H01L 51/00*     (2006.01)

(58) Field of Classification Search
    CPC .............. H01L 51/42; H01L 21/31058; H01L 21/02107; H01L 21/02123; H01L 21/02126; H01L 21/0214
    USPC ...... 257/40, 642, 759; 438/99, 82, 725, 780, 438/623
    See application file for complete search history.

(56) References Cited

U.S. PATENT DOCUMENTS

| | | | |
|---|---|---|---|
| 2001/0031379 | A1 | 10/2001 | Tera et al. |
| 2009/0272969 | A1* | 11/2009 | Suh ..................... H01L 51/0017 257/40 |
| 2011/0049730 | A1 | 3/2011 | Schmid et al. |
| 2014/0264297 | A1* | 9/2014 | Kumar ................ H01L 51/5253 257/40 |
| 2015/0311476 | A1* | 10/2015 | Gaertner ............. H01L 51/5275 257/98 |
| 2016/0043345 | A1* | 2/2016 | Goden ................. H01L 27/326 257/40 |

FOREIGN PATENT DOCUMENTS

| | | |
|---|---|---|
| JP | 2008-273211 A | 11/2008 |
| JP | 2011-511403 A | 4/2011 |
| JP | 2011-517302 A | 6/2011 |
| JP | 2013-101984 A | 5/2013 |
| JP | 2013-187019 A | 9/2013 |
| JP | 2014-180794 A | 9/2014 |
| JP | 2015-069857 A | 4/2015 |
| KR | 10-2005-0021152 A | 3/2005 |
| KR | 10-2010-0117633 A | 11/2010 |
| WO | WO 2012/039310 A1 | 3/2012 |

OTHER PUBLICATIONS

Office Action dated Aug. 24, 2017, in Taiwanese Patent Application No. 105126828.
Office Action dated Feb. 14, 2018, in Korean Patent Application No. 10-2016-0151774.
Certification document filed in Japanese Patent Application No. 2016-159659 to claim exception to loss of novelty, Aug. 2016.
Program (agenda), The 2$^{nd}$ Organic EL and Inorganic EL Illumination Study Group Meeting, hosted by Japanese Ministry of Economy, Trade and Industry, Feb. 29, 2016.
Office Action dated Feb. 4, 2020, in Japanese Patent Application No. 2016-159659.
Office Action dated Jul. 7, 2020, in Japanese Patent Application No. 2016-159659.
Office Action dated Jun. 29, 2021, in Japanese Patent Application No. 2020-181019.

* cited by examiner

METHOD OF FORMING PROTECTION FILM FOR ORGANIC EL DEVICE, METHOD OF MANUFACTURING DISPLAY DEVICE AND DISPLAY DEVICE

TECHNICAL FIELD OF THE INVENTION

The present invention relates to a method of forming a protection film for an organic EL device, a method of manufacturing a display device and a display device, and can be effectively applied to, for example, a method of manufacturing an organic EL display device and an organic EL display device.

BACKGROUND OF THE INVENTION

The development of an organic electroluminescence device using electroluminescence as a light emitting device has been advancing. Note that the organic electroluminescence device is referred to as an organic EL device. The electroluminescence is a light emitting phenomenon which occurs when a voltage is applied to a material, and the device which causes the electroluminescence with an organic material is particularly referred to as an organic EL device (organic electroluminescence device). The organic EL device is a current-injection device and exhibits diode characteristics, and is thus referred to also as an organic light emitting diode (OLED).

Japanese Patent Application Laid-Open Publication No. 2013-187019 (Patent Document 1) and Japanese Patent Application Laid-Open Publication No. 2015-69857 (Patent Document 2) describe technologies relating to an organic EL display device. Japanese Patent Application Laid-Open Publication No. 2001-284042 (Patent Document 3) describes a technology relating to an organic EL device. Japanese Patent Application Laid-Open Publication No. 2006-278486 (Patent Document 4) describes a technology relating to film formation by the ALD method. International Publication No. 2012/039310 (Patent Document 5) describes a technology relating to a method of manufacturing an organic EL device.

SUMMARY OF THE INVENTION

Organic EL devices are vulnerable to water, and it is thus desirable to prevent the transmission of water to the organic EL device by forming a protection film so as to cover the organic EL device. The performance improvement is required also in the protection film for the organic EL device.

The other problems and novel characteristics will be apparent from the description of the present specification and the accompanying drawings.

According to an embodiment, a method of forming a protection film includes the steps of (a) forming a first insulating film containing Si by a plasma CVD method so as to cover an organic EL device; (b) forming a second insulating film containing Al over the first insulating film by an ALD method; and (c) forming a third insulating film containing Si over the second insulating film by the plasma CVD method. The protection film for the organic EL device is formed of a laminated film of the first insulating film, the second insulating film and the third insulating film.

According to an embodiment, it is possible to improve the performance of a protection film for an organic EL device.

BRIEF DESCRIPTIONS OF THE DRAWINGS

DESCRIPTIONS OF THE PREFERRED EMBODIMENTS

Figure 1:
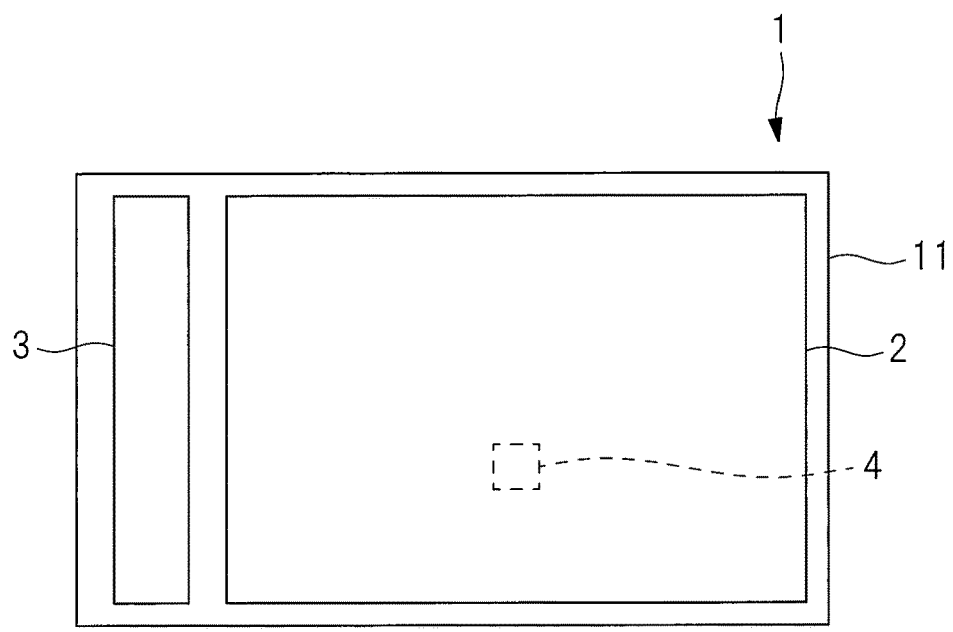
FIG. 1 is a plan view showing an overall configuration of a display device of an embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

Embodiment

<Overall Structure of Display Device>

A display device of the present embodiment is an organic EL display device (organic electroluminescence display device) using an organic EL device. The display device of the present embodiment will be described below with reference to drawings.

FIG. 1 is a plan view showing an overall configuration of a display device 1 of the present embodiment.

The display device 1 shown in FIG. 1 includes a display unit 2 and a circuit unit 3. A plurality of pixels are arranged in an array in the display unit 2 and this enables to display images. Various circuits are formed as needed in the circuit unit 3, and for example, a driving circuit, a control circuit and the like are formed. The circuits in the circuit unit 3 are connected to pixels in the display unit 2 as needed. It is also possible to provide the circuit unit 3 outside the display device 1. The planar shape of the display device 1 is, for example, a rectangular shape though various shapes may be adopted.

Figure 2:
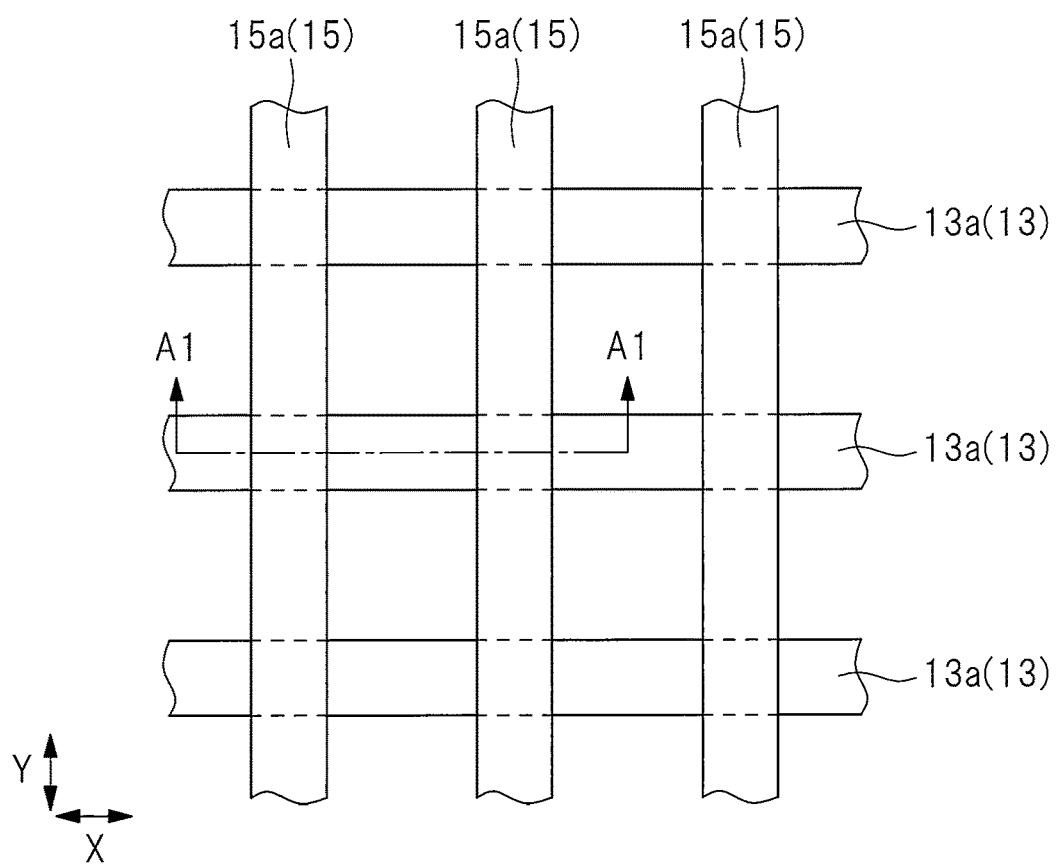
FIG. 2 is a plan view showing a principal part of the display device of the embodiment.
Figure 3:
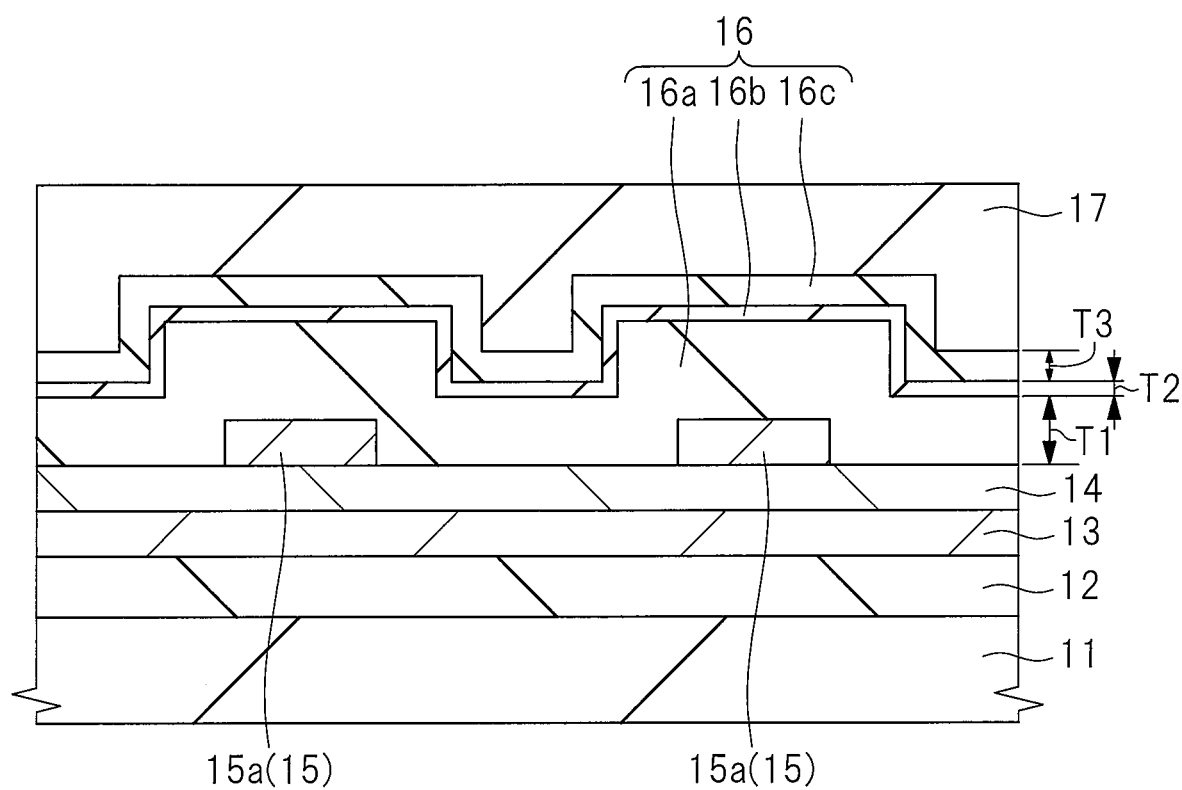
FIG. 3 is a cross-sectional view showing a principal part of the display device of the embodiment.

FIG. 2 is a plan view showing a principal part of the display device 1 and FIG. 3 is a cross-sectional view showing a principal part of the display device 1. FIG. 2 shows a part of the display unit 2 of the display device 1 (region 4 shown in FIG. 1) in an enlarged manner. FIG. 3 almost corresponds to the cross-sectional view at the position of the line A1-A1 of FIG. 2.

A substrate 11 constituting a base of the display device 1 has insulation properties. In addition, the substrate 11 is a flexible substrate (film substrate) and has flexibility. Therefore, the substrate 11 is a flexible substrate with insulation properties, that is, a flexible insulating substrate. The substrate 11 further has translucency in some cases. A film-shaped plastic substrate (plastic film) may be used as the substrate 11. The substrate 11 is present over the entire plane of the display device 1 of FIG. 1 and constitutes the lowermost layer of the display device 1. Therefore, the planar shape of the substrate 11 is almost the same as the planar shape of the display device 1 and is, for example, a rectangular shape though various shapes may be adopted. Of the two main surfaces of the substrate 11 located on opposite sides, the main surface on which an organic EL device is disposed, that is, the main surface on which a passivation film 12, an electrode layer 13, an organic layer 14, an electrode layer 15 and a protection film 16 described later are formed is referred to as an upper surface of the substrate 11. Also, the main surface of the substrate 11 on an opposite side of the upper surface is referred to as a lower surface of the substrate 11.

The passivation film (passivation layer) 12 is formed over the upper surface of the substrate 11. The passivation film 12 is made of an insulating material (insulating film) and is made of, for example, a silicon oxide film. Although the passivation film 12 is not formed in some cases, it is more preferable to form the passivation film 12. The passivation film 12 can be formed over the almost entire upper surface of the substrate 11.

The passivation film 12 has a function of preventing (blocking) the transmission of water to the organic EL device (in particular, organic layer 14) from the side of the substrate 11. Therefore, the passivation film 12 can function as a protection film on the lower side of the organic EL device. Meanwhile, the protection film 16 can function as a protection film on the upper side of the organic EL device and has a function of preventing (blocking) the transmission of water to the organic EL device (in particular, organic layer 14) from the upper side.

The organic EL device is formed over the upper surface of the substrate 11 with the passivation film 12 interposed therebetween. The organic EL device is made up of the electrode layer 13, the organic layer 14 and the electrode layer 15. Namely, the electrode layer 13, the organic layer 14 and the electrode layer 15 are sequentially formed (laminated) from below over the passivation film 12 on the substrate 11, and the electrode layer 13, the organic layer 14 and the electrode layer 15 form the organic EL device.

The electrode layer 13 is a lower electrode layer and the electrode layer 15 is an upper electrode layer. The electrode layer 13 constitutes one of an anode and a cathode and the electrode layer 15 constitutes the other of the anode and the cathode. Namely, when the electrode layer 13 is an anode (anode layer), the electrode layer 15 is a cathode (cathode layer), and when the electrode layer 13 is a cathode (cathode layer), the electrode layer 15 is an anode (anode layer). Each of the electrode layer 13 and the electrode layer 15 is made of a conductive film.

One of the electrode layer 13 and the electrode layer 15 is preferably formed of a metal film such as an aluminum (Al) film so as to be able to function as a reflective electrode, and the other of the electrode layer 13 and the electrode layer 15 is preferably formed of a transparent conductive film made of ITO (indium tin oxide) or the like so as to be able to function as a transparent electrode. When a so-called bottom emission method in which light is emitted from the lower surface of the substrate 11 is adopted, the electrode layer 13 can be formed as a transparent electrode, and when a so-called top emission method in which light is emitted from the upper surface of the substrate 11 is adopted, the electrode layer 15 can be formed as a transparent electrode. In addition, when the bottom emission method is adopted, a transparent substrate with translucency (transparent flexible substrate) can be used as the substrate 11.

The electrode layer 13 is formed over the passivation film 12 on the substrate 11, the organic layer 14 is formed over the electrode layer 13, and the electrode layer 15 is formed over the organic layer 14. Thus, the organic layer 14 is interposed between the electrode layer 13 and the electrode layer 15.

The organic layer 14 includes at least an organic light emitting layer. The organic layer 14 can further include any of a hole transport layer, a hole injection layer, an electron transport layer and an electron injection layer as needed other than the organic light emitting layer. Therefore, the organic layer 14 can have, for example, a single layer structure of an organic light emitting layer, a laminated structure including a hole transport layer, an organic light emitting layer and an electron transport layer or a laminated structure including a hole injection layer, a hole transport layer, an organic light emitting layer, an electron transport layer and an electron injection layer.

The electrode layer 13 has, for example, a stripe-shaped pattern extending in an X direction. Namely, the electrode layer 13 has a configuration in which a plurality of linear electrodes (electrode patterns) 13a extending in the X direction are arranged in a Y direction at regular intervals. The electrode layer 15 has, for example, a stripe-shaped pattern extending in the Y direction. Namely, the electrode layer 15 has a configuration in which a plurality of linear electrodes (electrode patterns) 15a extending in the Y direction are arranged in the X direction at regular intervals. In other words, the electrode layer 13 includes a group of stripe-shaped electrodes extending in the X direction, and the electrode layer 15 includes a group of stripe-shaped electrodes extending in the Y direction. The X direction and the Y direction mentioned here are directions crossing each other, and are more specifically directions orthogonally crossing each other. In addition, the X direction and the Y direction are directions almost parallel with the upper surface of the substrate 11.

The extending direction of the electrodes 15a constituting the electrode layer 15 is the Y direction, and the extending direction of the electrodes 13a constituting the electrode layer 13 is the X direction. Therefore, the electrodes 15a and the electrodes 13a cross each other when seen in a plan view. Note that "when seen in a plan view" means a case of seeing a plane almost parallel with the upper surface of the substrate 11. Each of intersecting portions of the electrodes 15a and the electrodes 13a has a structure in which the organic layer 14 is vertically sandwiched between the electrode 15a and the electrode 13a. Therefore, the organic EL device (organic EL device constituting pixel) made up of the electrode 13a, the electrode 15a and the organic layer 14 between the electrodes 13a and 15a is formed at each of the intersecting portions of the electrodes 15a and the electrodes 13a, and the organic EL device forms the pixel. The organic light emitting layer in a part of the organic layer 14 sandwiched between the electrode 15a and the electrode 13a can emit light by applying a predetermined voltage between the electrode 15a and the electrode 13a. Namely, the organic EL device constituting each pixel can emit light. The electrode 15a functions as an upper electrode (one of anode and cathode) of the organic EL device, and the electrode 13a functions as a lower electrode (the other of anode and cathode) of the organic EL device.

The organic layer 14 can be formed over the entire display unit 2. Alternatively, the organic layer 14 may be formed to have the same pattern as the electrode layer 13 (namely, the same pattern as the plurality of electrodes 13a constituting the electrode layer 13) or may be formed to have the same pattern as the electrode layer 15 (namely, the same pattern as the plurality of electrodes 15a constituting the electrode layer 15). In any case, the organic layer 14 is present at each of the intersecting portions of the plurality of electrodes 13a constituting the electrode layer 13 and the plurality of electrodes 15a constituting the electrode layer 15.

As described above, in the display unit 2 of the display device 1, the plurality of organic EL devices (pixels) are arranged in an array over the substrate 11 when seen in a plan view.

Note that the case in which the electrode layers 13 and 15 have the strip-shaped pattern has been described here. Therefore, in the plurality of organic EL devices (pixels) arranged in an array, the lower electrodes (electrodes 13a) of the organic EL devices arranged in the X direction are connected to each other, and the upper electrodes (electrodes 15a) of the organic EL devices arranged in the Y direction are connected to each other. However, the configuration of the organic EL devices arranged in an array is not limited to this and can be modified in various ways.

For example, the case in which neither the upper electrodes nor the lower electrodes of the plurality of organic EL devices arranged in an array are connected to each other and the organic EL devices are independently arranged is also possible. In this case, each of the organic EL devices is formed of an isolated pattern having a laminated structure of a lower electrode, an organic layer and an upper electrode, and the plurality of isolated organic EL devices are arranged in an array. In this case, an active device such as a TFT (thin film transistor) can be provided in addition to the organic EL device in each pixel, and the pixels can be connected through wirings as needed.

The protection film (protection layer) 16 is formed over the upper surface of the substrate 11 (passivation film 12) so as to cover the organic EL device, that is, the electrode layer 13, the organic layer 14 and the electrode layer 15. When the organic EL devices are arranged in an array in the display unit 2, the protection film 16 is formed so as to cover the organic EL devices arranged in an array. Therefore, the protection film 16 is preferably formed over the entire display unit 2 and is preferably formed over the almost entire upper surface of the substrate 11. It is possible to protect the organic EL device (electrode layer 13, organic layer 14 and electrode layer 15) and to prevent (block) the transmission of water to the organic EL device, in particular, the transmission of water to the organic layer 14 by covering the organic EL device (electrode layer 13, organic layer 14 and electrode layer 15) with the protection film 16. Namely, it is possible to prevent the water intrusion to the organic EL device by providing the protection film 16. The protection film 16 is a protection film for the organic EL device.

However, it is sometimes necessary to expose a part of an electrode or a wiring from the protection film 16. In such a case, a region in which the protection film 16 is not formed is provided in apart of the upper surface of the substrate 11 instead of forming the protection film 16 over the entire region of the upper surface of the substrate 11, and a part of the electrode or the wiring can be exposed from there (region in which the protection film 16 is not formed). Even in such a case, it is preferable that the organic layer 14 is not exposed from the region in which the protection film 16 is not formed.

In the present embodiment, the protection film 16 is made of a laminated film of an insulating film (insulating layer) 16a, an insulating film (insulating layer) 16b over the insulating film 16a and an insulating film (insulating layer) 16c over the insulating film 16b. Namely, the protection film 16 includes three layers of the insulating film 16a, the insulating film 16b and the insulating film 16c.

Of the insulating films 16a, 16b and 16c constituting the protection film 16, the insulating film 16a and the insulating film 16c are insulating films formed by the plasma CVD (Chemical Vapor Deposition) method, and the insulating film 16b is an insulating film formed by the ALD (Atomic Layer Deposition) method. It is more preferable that the insulating film 16a and the insulating film 16c are formed by the ICP-CVD method (Inductively Coupled Plasma CVD method).

A silicon nitride film, a silicon oxide film or a silicon oxynitride film can be preferably used as the insulating film 16a, and a silicon nitride film is most preferable. Also, a silicon nitride film, a silicon oxide film or a silicon oxynitride film can be preferably used as the insulating film 16c, and a silicon nitride film is most preferable.

An insulating film containing aluminum (Al) can be used as the insulating film 16b, and an aluminum oxide film, an aluminum oxynitride film or an aluminum nitride film can be preferably used. Among them, an aluminum oxide film or an aluminum oxynitride film is particularly preferable.

A resin film (resin layer, resin insulating film, organic insulating film) 17 is formed over the protection film 16. Namely, the resin film 17 is formed over the insulating film 16c. For example, PET (polyethylene terephthalate) can be preferably used as a material of the resin film 17.

The formation of the resin film 17 may be omitted. However, the case in which the resin film 17 is formed is more preferable than the case in which the resin film 17 is not formed. Since the resin film 17 is soft, the formation of the resin film 17 makes the display device 1 easy to operate.

<Method of Manufacturing Display Device>

Figure 4:
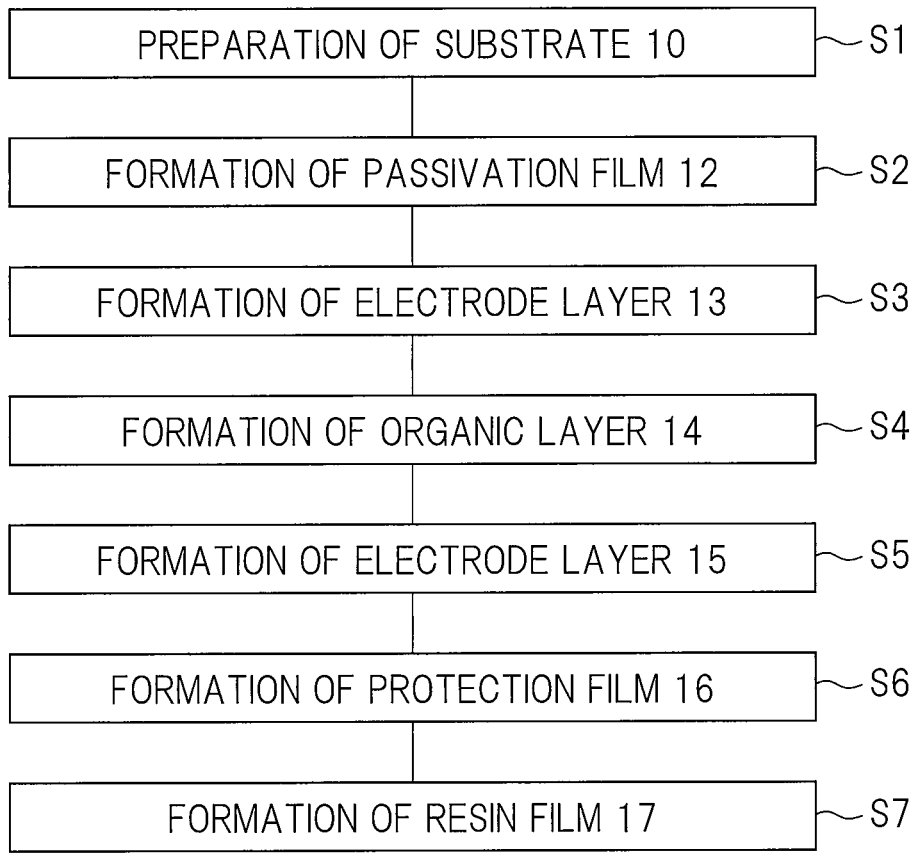
FIG. 4 is a process flowchart showing a manufacturing process of the display device of the embodiment.
Figure 5:
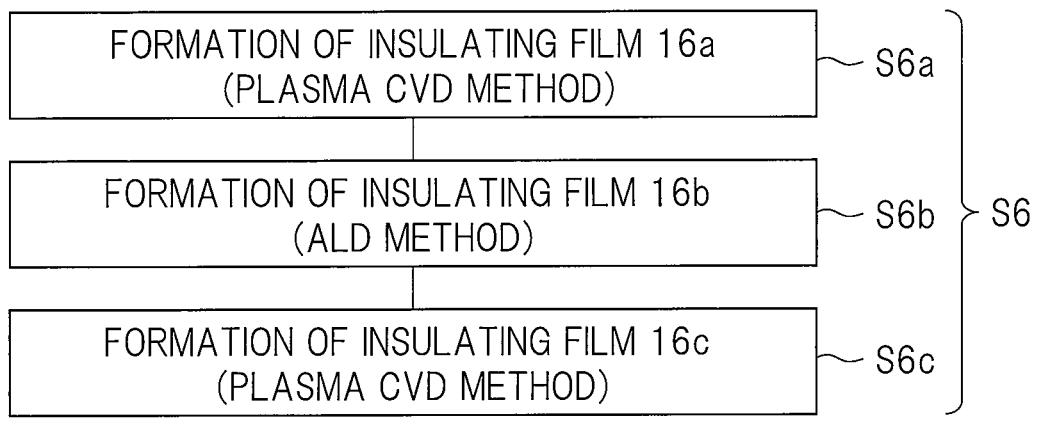
FIG. 5 is a process flowchart showing a forming process of a protection film in the manufacturing process of the display device of the embodiment.

A method of manufacturing the display device 1 of the present embodiment will be described with reference to drawings. FIG. 4 is a process flowchart showing a manufacturing process of the display device 1 of the present embodiment. FIG. 5 is a process flowchart showing details of a forming process of the protection film 16 in the manufacturing process of the display device 1 of the present embodiment. FIG. 6 to FIG. 13 are cross-sectional views each showing a principal part in the manufacturing process of the display device 1 of the present embodiment, and cross-sectional views of the region corresponding to FIG. 3 are shown. Note that the manufacturing process of the display unit 2 of the display device 1 will be mainly described here.

Figure 6:
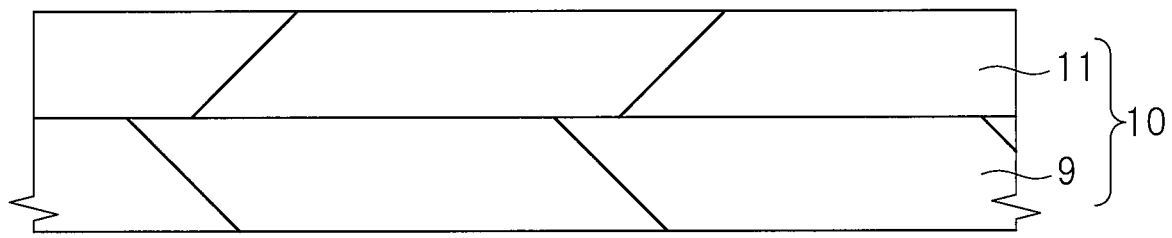
FIG. 6 is a cross-sectional view showing a principal part in the manufacturing process of the display device of the embodiment.

As shown in FIG. 6, a substrate 10 obtained by bonding a glass substrate 9 and a flexible substrate serving as the substrate 11 is prepared (step S1 of FIG. 4). The substrate 11 has flexibility but the substrate 11 is fixed to the glass substrate 9 by bonding the substrate 11 to the glass substrate 9. This facilitates the formation of various films onto the substrate 11 and the processing of the films. Note that the lower surface of the substrate 11 is bonded to the glass substrate 9.

Figure 7:
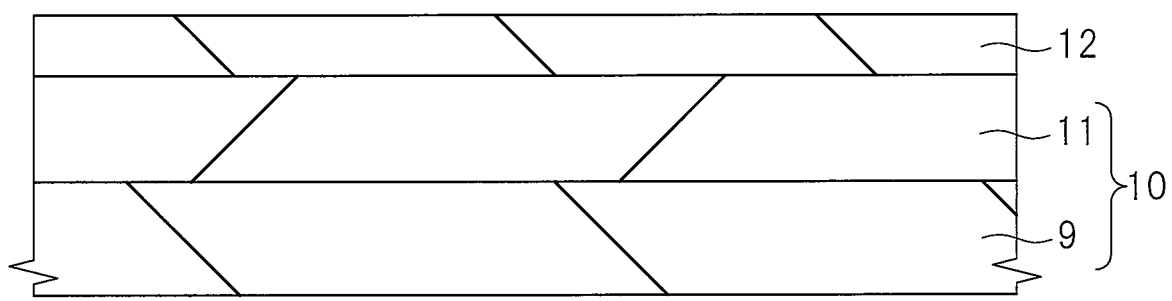
FIG. 7 is a cross-sectional view showing a principal part in the manufacturing process of the display device continued from FIG. 6.

Next, as shown in FIG. 7, the passivation film 12 is formed over the upper surface of the substrate 10 (step S2 of FIG. 4). Note that the upper surface of the substrate 10 is synonymous with the upper surface of the substrate 11.

The passivation film 12 can be formed by the sputtering method, the CVD method, the ALD method or the like. The passivation film 12 is made of an insulating material and is made of, for example, a silicon oxide film. For example, a silicon oxide film formed by the CVD method can be preferably used as the passivation film 12.

Figure 8:
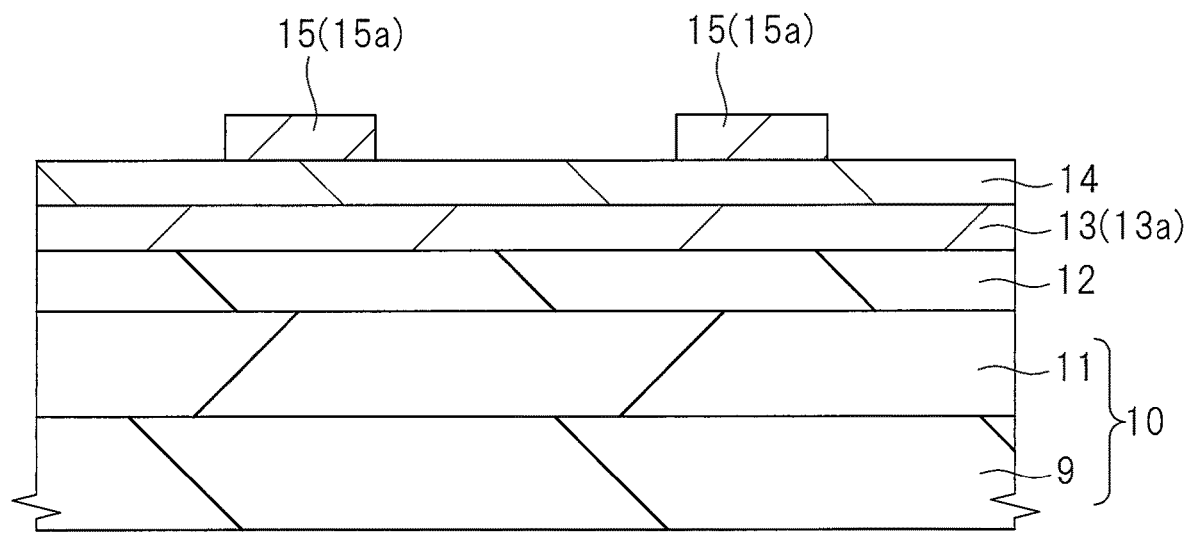
FIG. 8 is a cross-sectional view showing a principal part in the manufacturing process of the display device continued from FIG. 7.

Next, as shown in FIG. 8, the organic EL device made up of the electrode layer 13, the organic layer 14 over the electrode layer 13 and the electrode layer 15 over the organic layer 14 is formed over the upper surface of the substrate 10, that is, over the passivation film 12. Namely, the electrode layer 13, the organic layer 14 and the electrode layer 15 are sequentially formed over the passivation film 12 (steps S3, S4 and S5 of FIG. 4). For example, this process can be carried out in the following manner.

Namely, the electrode layer 13 is formed over the upper surface of the substrate 10, that is, over the passivation film 12 (step S3 of FIG. 4). The electrode layer 13 can be formed by, for example, forming a conductive film over the passivation film 12 and then patterning the conductive film by the photolithography technique and the etching technique. Thereafter, the organic layer 14 is formed over the electrode layer 13 (step S4 of FIG. 4). The organic layer 14 can be formed by, for example, the deposition method (vacuum deposition method) using a mask. Then, the electrode layer 15 is formed over the organic layer 14 (step S5 of FIG. 4). The electrode layer 15 can be formed by, for example, the deposition method using a mask.

After the organic EL device made up of the electrode layer 13, the organic layer 14 and the electrode layer 15 is formed, the protection film 16 is formed over the upper surface of the substrate 10, that is, over the electrode layer 15 (step S6 of FIG. 4). The protection film 16 is formed so as to cover the organic EL device.

Since the protection film 16 is made of a laminated film of the insulating film 16a, the insulating film 16b over the insulating film 16a and the insulating film 16c over the insulating film 16b, the forming process of the protection film 16 in the step S6 includes a forming process of the insulating film 16a in the step S6a, a forming process of the insulating film 16b in the step S6b and a forming process of the insulating film 16c in the step S6c as shown in FIG. 5. The forming process of the insulating film 16b in the step S6b is carried out after the forming process of the insulating film 16a in the step S6a, and then the forming process of the insulating film 16c in the step S6c is carried out.

Figure 9:
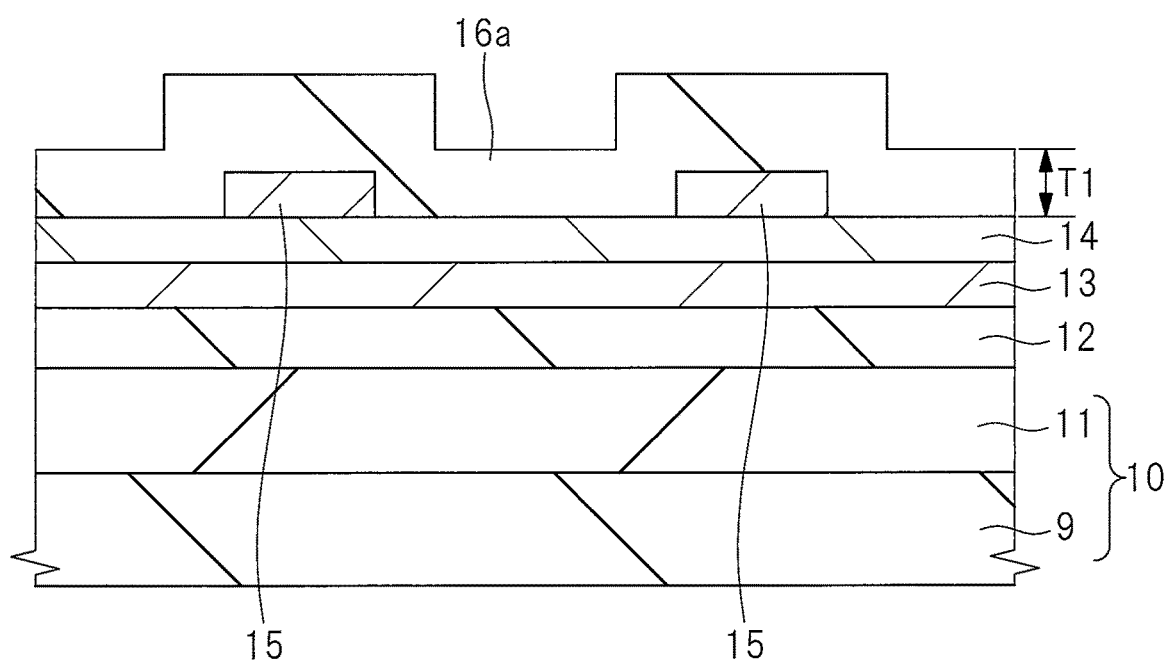
FIG. 9 is a cross-sectional view showing a principal part in the manufacturing process of the display device continued from FIG. 8.
Figure 10:
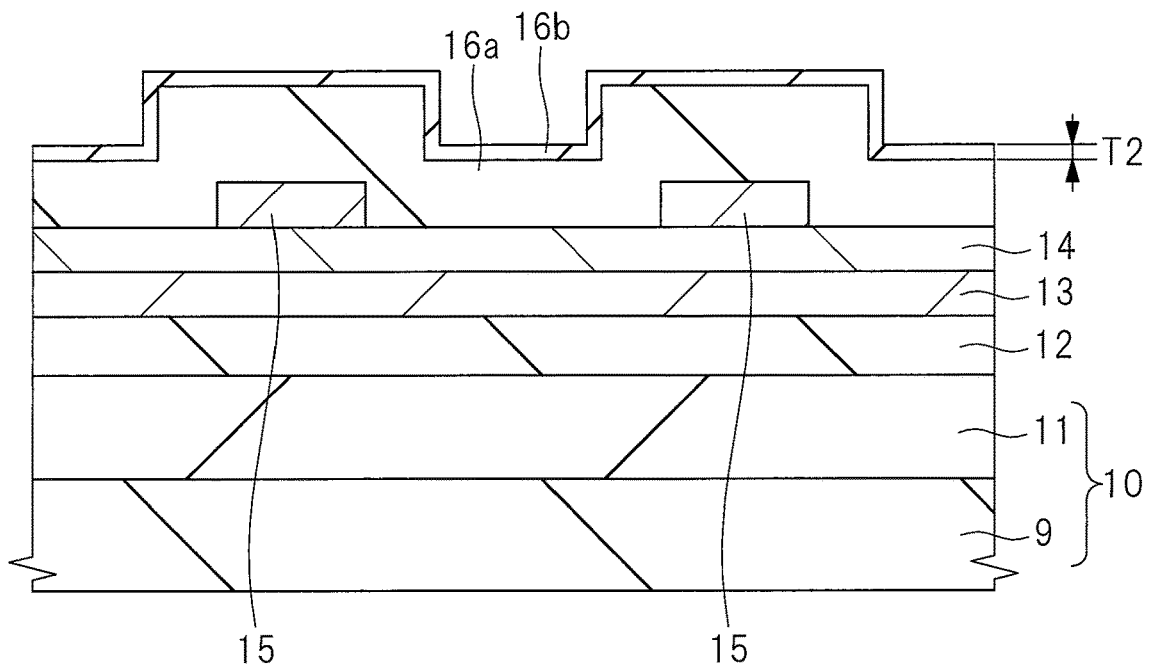
FIG. 10 is a cross-sectional view showing a principal part in the manufacturing process of the display device continued from FIG. 9.
Figure 11:
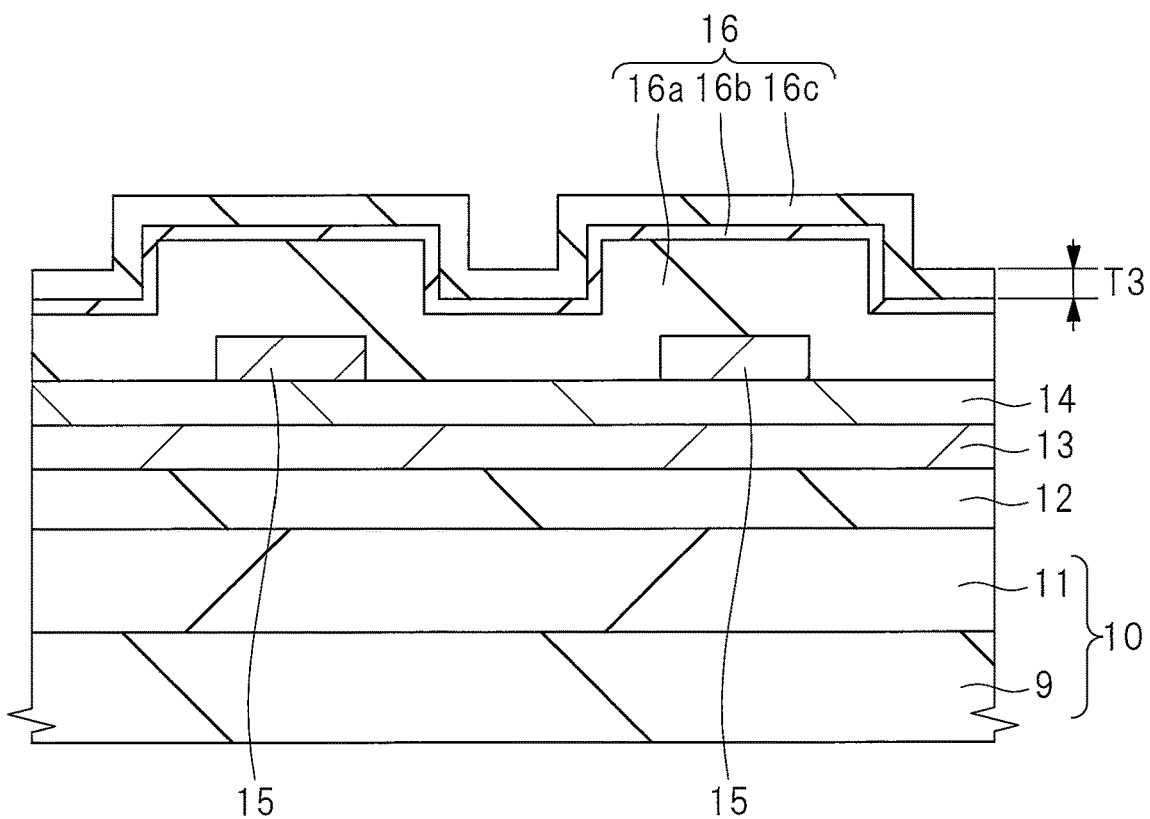
FIG. 11 is a cross-sectional view showing a principal part in the manufacturing process of the display device continued from FIG. 10.

Accordingly, the forming process of the protection film 16 in the step S6 can be specifically carried out in the following manner. Namely, as shown in FIG. 9, the insulating film 16a is first formed by the plasma CVD method over the substrate 10, that is, over the electrode layer 15 (step S6a of FIG. 5). The insulating film 16a is formed so as to cover the organic EL device. Then, as shown in FIG. 10, the insulating film 16b is formed by the ALD method over the insulating film 16a (step S6b of FIG. 5). Thereafter, as shown in FIG. 11, the insulating film 16c is formed by the plasma CVD method over the insulating film 16b (step S6c of FIG. 5). Consequently, the protection film 16 made of the laminated film of the insulating film 16a, the insulating film 16b and the insulating film 16c is formed.

In addition, it is sometimes necessary to expose a part of an electrode or a wiring from the protection film 16. In such a case, a region in which the protection film 16 is not formed is provided in a part of the upper surface of the substrate 10 instead of forming the protection film 16 over the entire region of the upper surface of the substrate 10, and a part of the electrode or the wiring can be exposed from there (region in which the protection film 16 is not formed). In this case, for example, the forming process of the protection film 16 in the step S6 can be carried out in the following manner. Namely, after a mask (metal mask) is disposed over the substrate 10, that is, over the electrode layer 15, the insulating film 16a is formed by the plasma CVD method. Thereafter, after removing the mask, a next mask (metal mask) is disposed over the substrate 10, that is, over the electrode layer 15, and the insulating film 16b is then formed over the insulating film 16a by the ALD method. Thereafter, after removing the mask, a next mask (metal mask) is disposed over the substrate 10, that is, over the electrode layer 15, and the insulating film 16c is then formed over the insulating film 16b by the plasma CVD method and the mask is removed. Consequently, the protection film 16 made of the laminated film of the insulating film 16a, the insulating film 16b and the insulating film 16c is formed. The insulating films 16a, 16b and 16c are formed and thus the protection film 16 is formed in the region exposed without being covered with the mask, but the insulating films 16a, 16b and 16c are not formed and thus the protection film 16 is not formed in the region covered with the mask. In this manner, the protection film 16 can be formed so as to cover the organic EL device, while the electrode or the wiring can be exposed from the region in which the protection film 16 is not formed as needed.

In any case, the insulating films 16a and 16c are formed by the plasma CVD method in the steps S6a and S6c, and the insulating film 16b is formed by the ALD method in the step S6b. It is more preferable to use the ICP-CVD method in the steps S6a and S6c.

Though details thereof will be described later, the insulating film 16b is formed in order to fill a pinhole, which has been formed in the insulating film 16a when forming the insulating film 16a by the plasma CVD method, with the insulating film 16b. For this reason, the insulating film 16b is formed over the insulating film 16a so as to be in contact with the insulating film 16a by the ALD method in the step S6b. Also, though details thereof will be described later, the insulating film 16c is formed in order to prevent the insulating film 16b from being in contact with water and reacting with the water. For this reason, the insulating film 16c is formed over the insulating film 16b so as to be in contact with the insulating film 16b by the plasma CVD method in the step S6c. Therefore, when the steps S6a, S6b and S6c are finished, the protection film 16 made of the laminated film of the insulating film 16a, the insulating film 16b and the insulating film 16c is formed, and the insulating film 16b is formed over the insulating film 16a to be in contact with the insulating film 16a and the insulating film 16c is formed over the insulating film 16b to be in contact with the insulating film 16b. Note that the insulating film 16a is formed so as to cover the organic EL device in the step S6a, and the protection film 16 is thus formed so as to cover the organic EL device.

Since the organic EL device (in particular, organic layer 14) is vulnerable to high temperature, it is preferable that the film forming temperature in each of the steps S6a, S6b and S6c, that is, the film forming temperature of each of the insulating films 16a, 16b and 16c is relatively low so as not to adversely affect the organic EL device (in particular, organic layer 14), and the temperature is preferably 100° C. or lower and can be specifically set to about 80° C.

In order to form a fine film even at such a low film forming temperature, a silicon nitride film, a silicon oxide film or a silicon oxynitride film is preferably used for the insulating films 16a and 16c formed by the plasma CVD method, and a silicon nitride film is particularly preferable among them. Also, an aluminum oxide film, an aluminum oxynitride film or an aluminum nitride film is preferably used for the insulating film 16b formed by the ALD method, and an aluminum oxide film or an aluminum oxynitride film is particularly preferable among them.

When the protection film 16 has been formed, the organic EL device made up of the electrode layer 13, the organic layer 14 and the electrode layer 15 is covered with the protection film 16. In the case in which the plurality of organic EL devices are arranged in an array, the plurality of organic EL devices are covered with the protection film 16.

Figure 12:
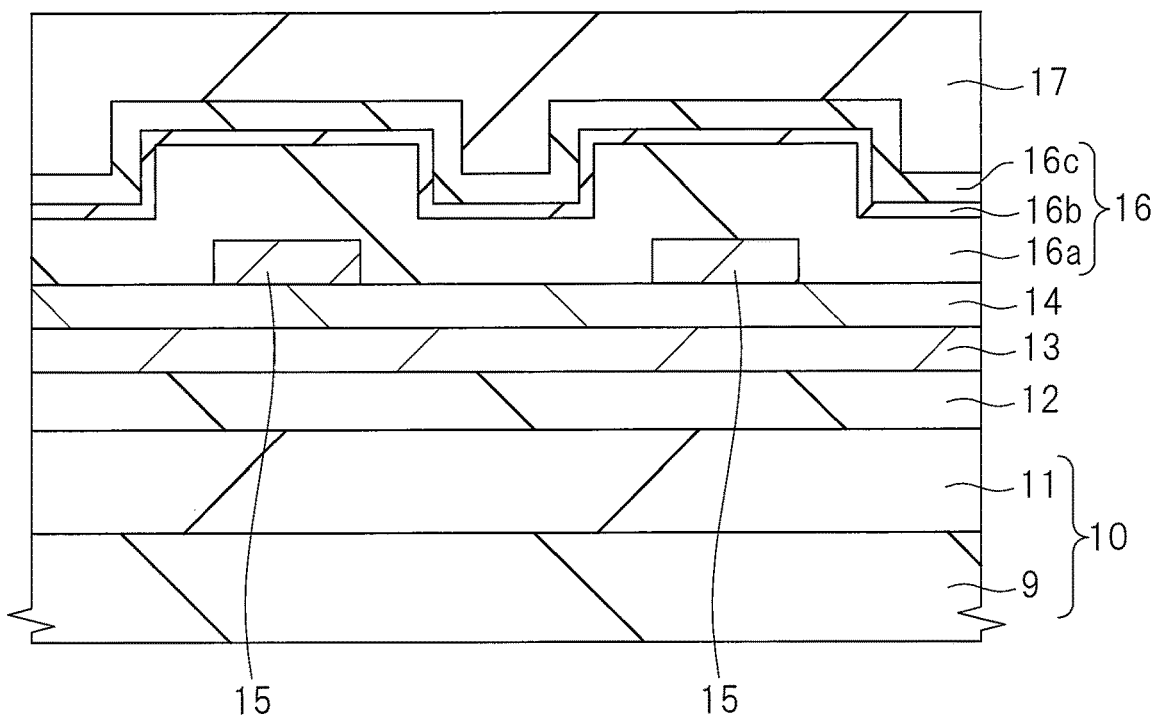
FIG. 12 is a cross-sectional view showing a principal part in the manufacturing process of the display device continued from FIG. 11.

After forming the protection film 16 in the step S6, the resin film 17 is formed over the upper surface of the substrate 10, that is, over the protection film 16 as shown in FIG. 12 (step S7 of FIG. 4).

Since the uppermost layer of the protection film 16 is the insulating film 16c, the resin film 17 is formed over the insulating film 16c. The resin film 17 is made of, for example, PET and can be formed by the spin-coating method or the like.

Figure 13:
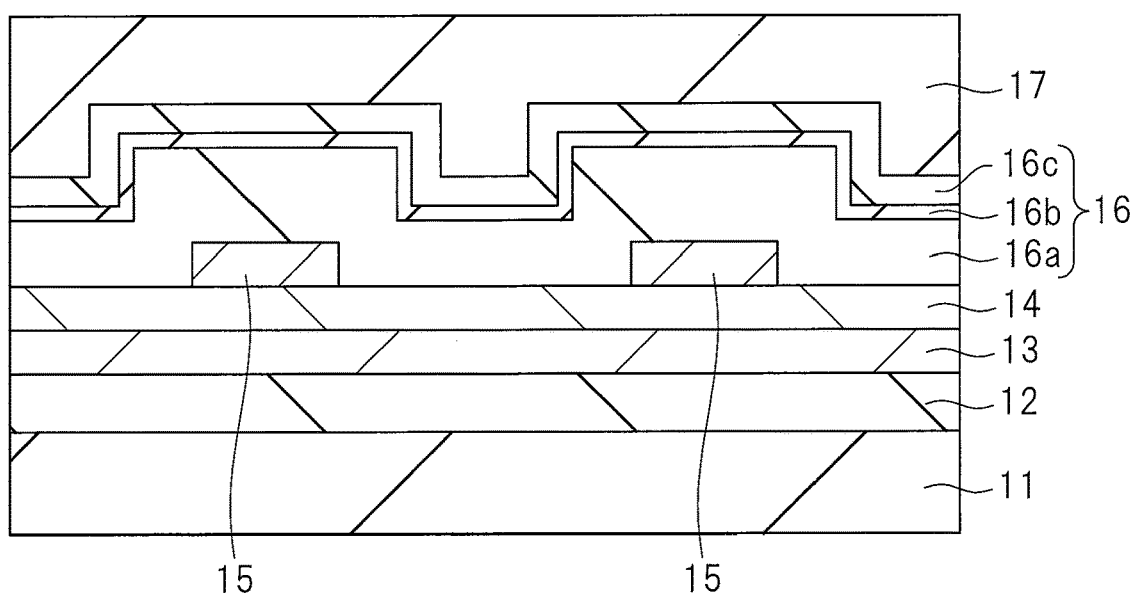
FIG. 13 is a cross-sectional view showing a principal part in the manufacturing process of the display device continued from FIG. 12.

Thereafter, as shown in FIG. 13, the substrate 11 is peeled off from the glass substrate 9, so that the substrate 11 and the resultant structure on the upper surface thereof are separated from the glass substrate 9. In this manner, the display device 1 can be manufactured.

Figure 14:
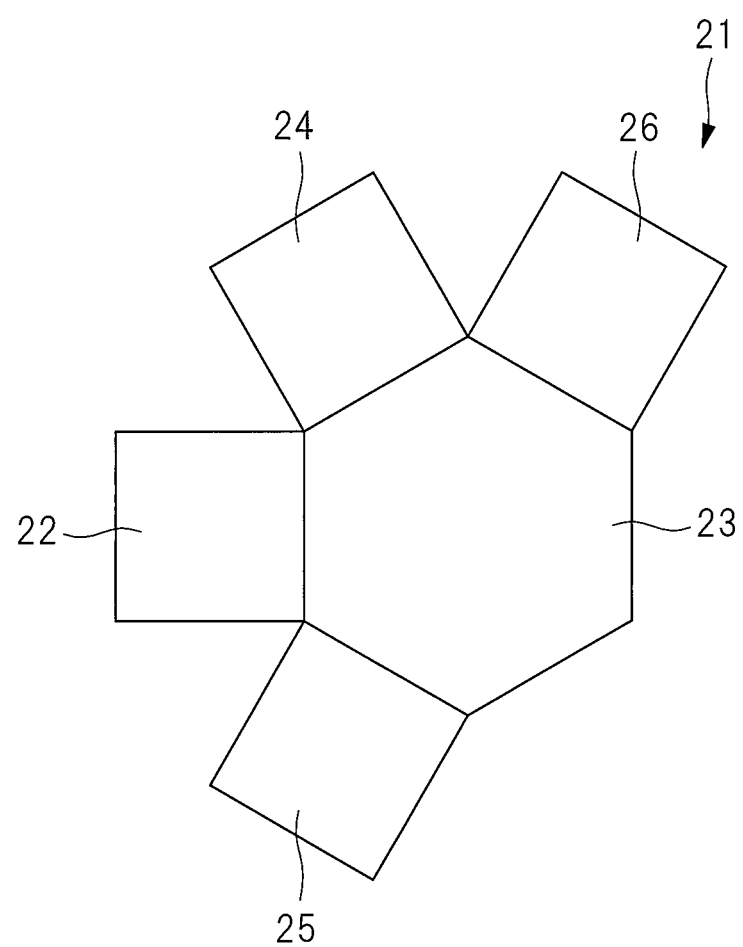
FIG. 14 is an explanatory diagram showing an example of a film forming apparatus for forming a protection film.

FIG. 14 is an explanatory diagram showing an example of a film forming apparatus for forming the protection film 16.

A film forming apparatus 21 in FIG. 14 is a multi-chamber film forming apparatus having a plurality of chambers. Specifically, the film forming apparatus 21 includes a load lock chamber 22, a transfer chamber 23 and a plurality of chambers (processing chambers, film forming chambers) 24, 25 and 26. Among them, the chambers 24 and 26 are chambers in which the film formation is carried out by the plasma CVD method, and the chamber 25 is a chamber in which the film formation is carried out by the ALD method. The chamber 24 is used to form the insulating film 16a, the chamber 25 is used to form the insulating film 16b, and the chamber 26 is used to form the insulating film 16c. The process flow of forming the protection film 16 by using the film forming apparatus 21 will be described below.

Figure 15:
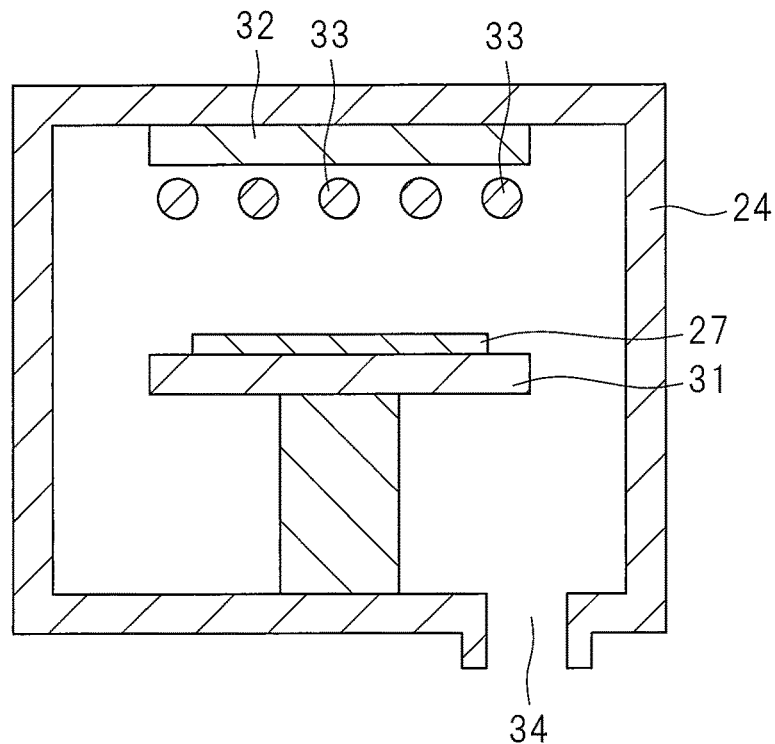
FIG. 15 is a cross-sectional view showing an example of a configuration of a film forming chamber using the plasma CVD method.
Figure 16:
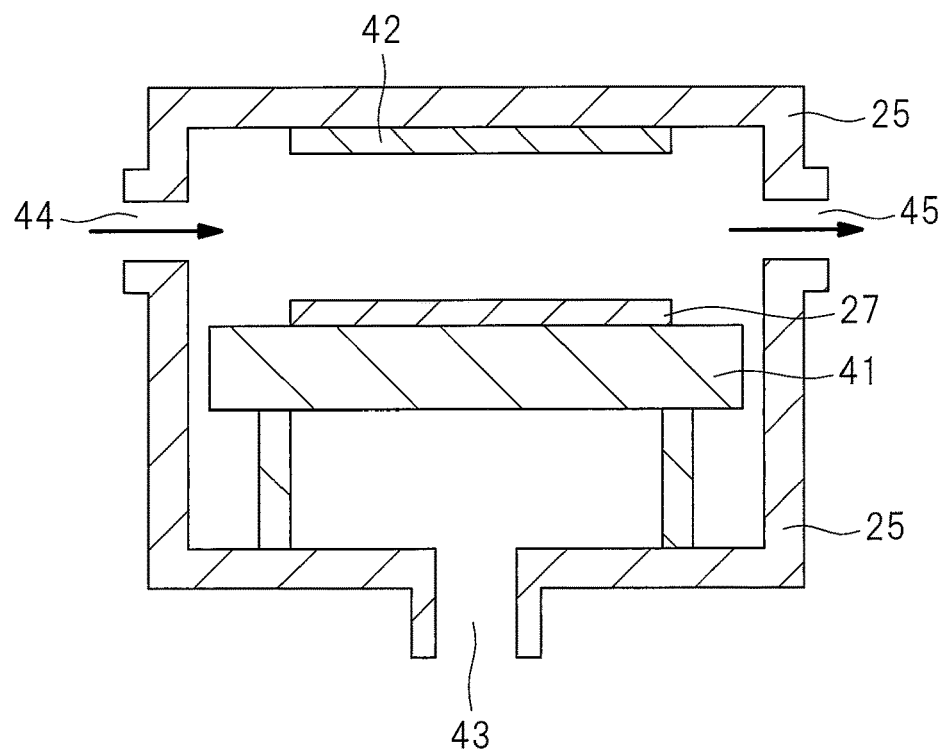
FIG. 16 is a cross-sectional view showing an example of a configuration of a film forming chamber using the ALD method.

First, after the process previous to the forming process of the protection film 16 has been finished, an object to be processed is loaded into the load lock chamber 22 of the film forming apparatus 21 in order to carry out the forming process of the protection film 16. Herein, the object to be processed which is loaded into the load lock chamber 22 is the substrate 10 on which the passivation film 12, the electrode layer 13, the organic layer 14, the electrode layer 15 and others described above have been formed, and the structure of FIG. 8 has been formed on the substrate 10. In FIG. 15 and FIG. 16 described later, it is denoted as an object to be processed 27 by attaching a reference character 27.

Then, the object to be processed loaded into the load lock chamber 22 is transferred (vacuum transfer) into the chamber 24 through the transfer chamber 23. Then, the insulating film 16a is formed by the plasma CVD method onto the object to be processed placed in the chamber 24. In this case, the step S6a described above is carried out in the chamber 24. Thereafter, the object to be processed in the chamber 24 is transferred (vacuum transfer) into the chamber 25 through the transfer chamber 23. Then, the insulating film 16b is formed by the ALD method onto the object to be processed placed in the chamber 25. In this case, the step S6b described above is carried out in the chamber 25. Thereafter, the object to be processed in the chamber 25 is transferred (vacuum transfer) into the chamber 26 through the transfer chamber 23. Then, the insulating film 16c is formed by the plasma CVD method onto the object to be processed placed in the chamber 26. In this case, the step S6c described above is carried out in the chamber 26. Thereafter, the object to be processed in the chamber 26 is transferred (vacuum transfer) into the load lock chamber 22 through the transfer chamber 23. Then, the object to be processed is taken out to the outside of the film forming apparatus 21 from the load lock chamber 22, and is conveyed to a manufacturing apparatus in which the next process (for example, forming process of the resin film 17) is carried out.

Alternatively, two load lock chambers of a take-in load lock chamber and a take-out load lock chamber may be provided in the film forming apparatus 21. In such a case, an object to be processed is taken in the take-in load lock chamber, is subjected to the processes of the steps S6a, S6b and S6c in the chambers 24, 25 and 26 through the transfer chamber 23, is taken out to the outside of the film forming apparatus 21 from the take-out load lock chamber, and is then conveyed to the next process.

In addition, in the case in which the film formation is carried out with a mask disposed over an object to be processed in each of the film forming processes of the insulating films 16a, 16b and 16c, a chamber for forming and removing a mask (mask chamber) may be connected to the transfer chamber 23 so that the mask is formed and removed in the mask chamber.

By using the film forming apparatus 21 in FIG. 14, the step S6a (forming process of the insulating film 16a), the step S6b (forming process of the insulating film 16b) and the step S6c (forming process of the insulating film 16c) described above can be continuously carried out without exposing the object to be processed to the atmosphere. Accordingly, the insulating film 16b can be formed over the insulating film 16a in the step S6b without forming any unnecessary film over the surface of the insulating film 16a after forming the insulating film 16a in the step S6a, and the insulating film 16c can be formed over the insulating film 16b in the step S6c without forming any unnecessary film over the surface of the insulating film 16b after forming the insulating film 16b in the step S6b. As a result, the protection film 16 made up of the insulating film 16a, the insulating film 16b and the insulating film 16c can be formed more appropriately, so that the effect of preventing the water intrusion by the protection film 16 can be achieved more reliably.

FIG. 15 is a cross-sectional view showing an example of a configuration of the chamber 24 in which the film formation by the plasma CVD method is carried out. Since the chamber 26 also has the same configuration as that of the chamber 24 shown in FIG. 15, the configuration of the chamber 24 will be described here as a representative of the chambers 24 and 26 with reference to FIG. 15.

As shown in FIG. 15, a stage 31 on which the object to be processed 27 is placed, a shower head (gas supplying unit) 32 disposed over the stage 31 and antennas 33 disposed below the shower head 32 are installed in the chamber 24. The antennas 33 are disposed close to the shower head 32 between the stage 31 and the shower head 32. In FIG. 15, the antennas 33 extend in the direction approximately perpendicular to the plane of paper in the chamber 24. An exhaust part (exhaust port) 34 of the chamber 24 is connected to a vacuum pump (not shown) or the like, so that the pressure in the chamber 24 can be controlled to a predetermined pressure.

In the film formation using the chamber 24, film forming gas is supplied from the shower head 32 in the chamber 24 and a radio-frequency power is applied to the antennas 33. When a silicon nitride film is to be formed, for example, mixed gas of $SiH_4$ gas (silane gas) and $NH_3$ gas (ammonia gas) can be used as the film forming gas. The gas is converted into plasma and reacted chemically, and generated particles of SiN (silicon nitride) are deposited over the object to be processed 27 placed on the stage 31, thereby forming a silicon nitride film.

FIG. 16 is a cross-sectional view showing an example of a configuration of the chamber 25 in which the film formation by the ALD method is carried out.

As shown in FIG. 16, a stage 41 on which the object to be processed 27 is placed and an upper electrode 42 disposed over the stage 41 are installed in the chamber 25. An exhaust part (exhaust port) 43 of the chamber 25 is connected to a vacuum pump (not shown) or the like, so that the pressure in the chamber 25 can be controlled to a predetermined pressure. In addition, the chamber 25 has a gas introducing part 44 for introducing gas into the chamber 25 and a gas discharging part 45 for discharging the gas from the chamber 25. Note that the flow of the gas introduced into the chamber 25 through the gas introducing part 44 and the flow of the gas discharged to the outside of the chamber 25 through the gas discharging part 45 are schematically depicted by arrows in FIG. 16 for easier understanding.

For example, the film formation using the chamber 25 can be carried out in the following manner.

First, as a first step, source gas is introduced into the chamber 25 through the gas introducing part 44. When an aluminum oxide film is to be formed, for example, TMA (Trimethylaluminum) gas can be used as the source gas. Particles of the source gas are adsorbed onto the surface of the object to be processed 27 placed on the stage 41.

Next, as a second step, the introduction of the source gas into the chamber 25 is stopped, and purge gas is introduced into the chamber 25 through the gas introducing part 44. As the purge gas, for example, inert gas can be used. By introducing the purge gas, source gas molecules adsorbed on the surface of the object to be processed 27 remain, but the other source gas is discharged (purged) to the outside of the chamber 25 through the gas discharging part 45 together with the purge gas.

Next, as a third step, reaction gas is introduced into the chamber 25 through the gas introducing part 44. When an aluminum oxide film is to be formed, for example, $O_2$ gas (oxygen gas) can be used as the reaction gas. Then, a radio-frequency power is applied between the upper electrode 42 and the stage 41. By this means, the $O_2$ gas is converted into plasma and is reacted with the source gas molecules adsorbed on the surface of the object to be processed 27. As a result, an atomic layer (single layer) of aluminum oxide is formed over the surface of the object to be processed 27.

Next, as a fourth step, the introduction of the reaction gas into the chamber 25 and the application of the radio-frequency power to the upper electrode 42 are stopped, and purge gas is introduced into the chamber 25 through the gas introducing part 44. As the purge gas, for example, inert gas can be used. By introducing the purge gas, the reaction gas is discharged (purged) to the outside of the chamber 25 through the gas discharging part 45 together with the purge gas.

By repeating the first step, the second step, the third step and the fourth step described above by several cycles, a desired film (for example, aluminum oxide film) with a desired thickness can be formed over the surface of the object to be processed 27.

When the insulating film 16a formed in the chamber 24 is a silicon nitride film, for example, the following conditions can be shown as an example of the film forming conditions of the silicon nitride film. Namely, a substrate temperature (film forming temperature) is 80° C., a flow rate of the $SiH_4$ gas is 100 sccm, a flow rate of the $NH_3$ gas is 150 sccm, RF power (radio frequency power) is 1000 W and a film forming rate is 100 nm/minute.

When the insulating film 16b formed in the chamber 25 is an aluminum oxide film, for example, the following conditions can be shown as an example of the film forming conditions of the aluminum oxide film. Namely, a substrate temperature (film forming temperature) is 80° C., a flow rate of the TMA gas is 50 sccm, a flow rate of the $O_2$ gas is 400 sccm, RF power (radio frequency power) is 800 W and a film forming rate is 4 nm/minute.

When the insulating film 16c formed in the chamber 26 is a silicon nitride film, for example, the following conditions can be shown as an example of the film forming conditions of the silicon nitride film. Namely, a substrate temperature (film forming temperature) is 80° C., a flow rate of the $SiH_4$ gas is 100 sccm, a flow rate of the $NH_3$ gas is 150 sccm, RF power (radio frequency power) is 1000 W and a film forming rate is 100 nm/minute.

<Background of Examination>

Organic EL devices are vulnerable to water, and it is thus desirable to prevent the transmission of water to the organic EL device by forming a protection film (water protection film) so as to cover the organic EL device. A Si-containing inorganic insulating film formed by the plasma CVD method is suitable for the protection film. This is because the Si-containing inorganic insulating film formed by the plasma CVD method can be formed at a low temperature and a film density thereof can be high, and it is thus preferable as the protection film to prevent the transmission of the water. Note that, since organic EL devices are vulnerable to high temperature and are deteriorated when exposed to high temperature, the film forming temperature of the protection film is desirably low to some extent. The Si-containing inorganic insulating film mentioned here is an inorganic insulating film containing Si (silicon) as a constituent element, and a silicon nitride film, a silicon oxide film and a silicon oxynitride film can be shown as examples thereof.

However, there is fear that a defect such as a pinhole (minute hole) is formed in the film when the film is formed by the plasma CVD method. If the protection film having the pinhole formed therein is used as it is, water intrudes through the pinhole and reaches the organic EL device, with the result that the organic EL device is deteriorated.

Thus, for the purpose of filling the pinhole formed when the Si-containing inorganic insulating film is formed by the plasma CVD method, the formation of an ALD film over the Si-containing inorganic insulating film is considered. Herein, the film formed by the ALD method is referred to as an ALD film. Since the ALD method is a film forming method with high coatability to stepped parts and holes, even when a pinhole is formed in the Si-containing inorganic insulating film formed by the plasma CVD method, the pinhole of the Si-containing inorganic insulating film can be filled with the ALD film by forming the ALD film over the Si-containing inorganic insulating film. Consequently, it is possible to prevent the water from reaching the organic EL device through the pinhole. As the ALD film to fill the pinhole, an Al-containing insulating film is desirably used in order to form a fine film at a low temperature. The Al-containing insulating film mentioned here is an insulating film containing aluminum (Al) as a constituent element, and an aluminum oxide film, an aluminum oxynitride film and an aluminum nitride film can be shown as examples thereof.

When a silicon oxide film or a silicon nitride film is to be formed by the ALD method, it is necessary to increase the film forming temperature to some extent. When a silicon oxide film or a silicon nitride film is to be formed at a relatively low temperature by the ALD method in consideration of the influence on the organic EL device, it is difficult to form a fine film. Therefore, an Al-containing insulating film is preferable as the ALD film to fill the pinhole formed in the protection film of the organic EL device.

However, since the Al-containing insulating film contains aluminum (Al), it easily reacts with water when it comes in contact with water. As a result, a reaction product is formed and the Al-containing insulating film itself is deteriorated. When the Al-containing insulating film itself is deteriorated, the effect of preventing the transmission of water through the pinhole by filling the pinhole with the Al-containing insulating film is degraded.

Accordingly, when a single film of a Si-containing inorganic insulating film formed by the plasma CVD method is used as a protection film for an organic EL device, a problem arises due to the pinhole formed in the Si-containing inorganic insulating film, and the function of preventing the transmission of water of the protection film is degraded. Meanwhile, when a laminated film of a Si-containing inorganic insulating film formed by the plasma CVD method and an Al-containing insulating film formed thereon by the ALD method is used as the protection film for the organic EL device, a problem arises due to that the Al-containing insulating film can react with water, and the function of preventing the transmission of water of the protection film is degraded. This leads to the decrease in reliability of the organic EL device and the decrease in reliability of the display device using the organic EL device (organic EL display device). For this reason, the performance improvement of the protection film for the organic EL device is required.

<Main Characteristics and Effects>

One of main characteristics of the present embodiment is that the protection film 16 for the organic EL device is made of a laminated film including the insulating film 16a formed by the plasma CVD method, the insulating film 16b formed over the insulating film 16a by the ALD method and the insulating film 16c formed over the insulating film 16b by the plasma CVD method.

The insulating film 16a is formed by the plasma CVD method. The plasma CVD method is advantageous in that the stress of the formed film is easily controlled and the coverage to the underlying film (in this case, organic EL device) by the formed film is good. A Si-containing inorganic insulating film formed by the plasma CVD method is preferable as the insulating film 16a, and the film formation at a low temperature is possible and the film density can be increased by using the Si-containing inorganic insulating film, and it is thus possible to enhance the function of preventing the transmission of water of the insulating film 16a without any adverse influence from the film forming process of the insulating film 16a on the organic EL device. A silicon nitride film, a silicon oxide film or a silicon oxynitride film can be preferably used as the insulating film 16a, and a silicon nitride film is most preferable. This is because a finer film can be formed at a low temperature when a silicon nitride film is formed by the plasma CVD method.

Figure 17:
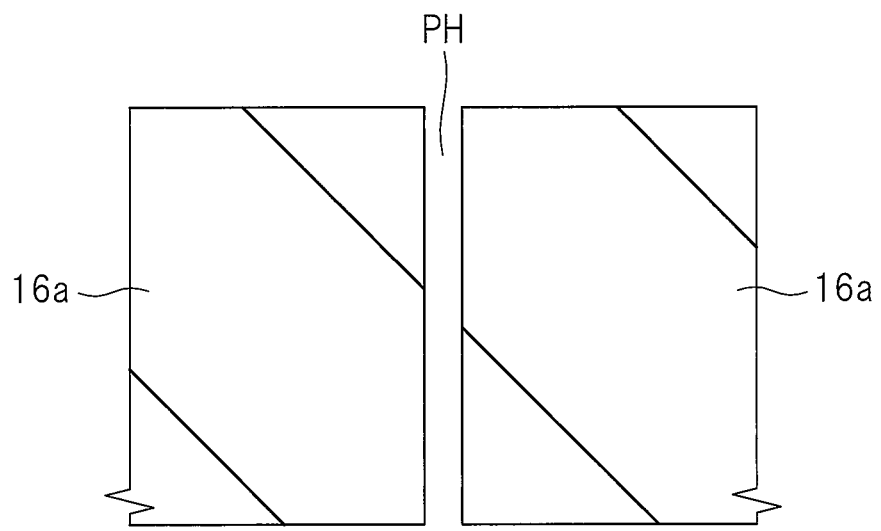
FIG. 17 is a partially enlarged cross-sectional view showing a part of FIG. 9 in an enlarged manner.

However, as a result of forming the insulating film 16a by the plasma CVD method, there is fear that a pinhole is formed in the insulating film 16a in the formation of the insulating film 16a. FIG. 17 is a partially enlarged cross-sectional view showing a part of the insulating film 16a in FIG. 9 (in the state of forming the insulating film 16a in the step S6a) in an enlarged manner, and the state in which a pinhole PH is formed in the insulating film 16a when the insulating film 16a is formed by the plasma CVD method is shown schematically. When the pinhole PH is formed in the insulating film 16a, there is fear that water intrudes into the organic EL device through the pinhole PH.

Figure 18:
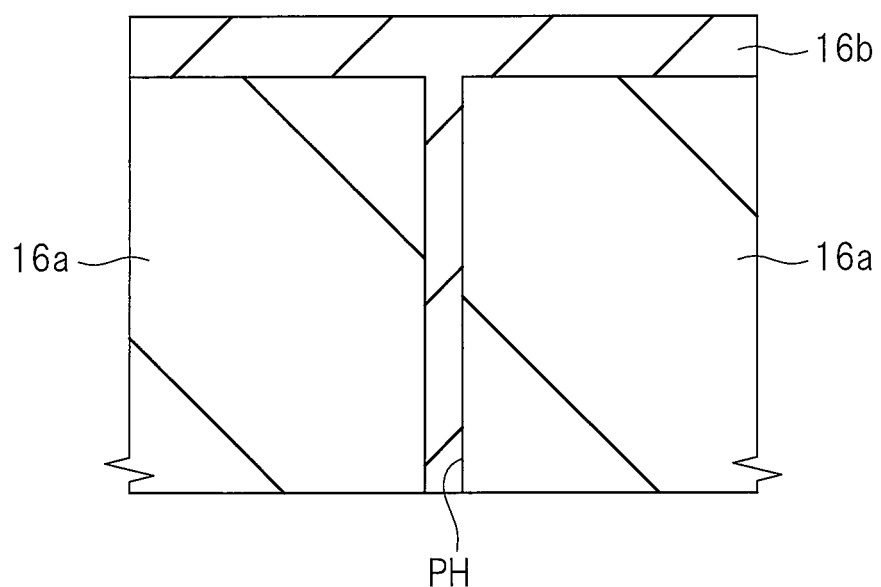
FIG. 18 is a partially enlarged cross-sectional view showing a part of FIG. 10 in an enlarged manner.

Therefore, in the present embodiment, the insulating film 16b is formed over the insulating film 16a. The insulating film 16b is an insulating film (inorganic insulating film) containing aluminum (Al) as a constituent element, that is, an Al-containing insulating film (Al-containing inorganic insulating film), and more specifically, is an aluminum oxide film, an aluminum oxynitride film or an aluminum nitride film. Among them, an aluminum oxide film or an aluminum oxynitride film is particularly preferable as the insulating film 16b. The insulating film 16b is formed by the ALD method so as to be able to fill the pinhole of the insulating film 16a. When the Al-containing insulating film described above is formed by using the ALD method as a film forming method, a fine film can be formed at a low temperature. Therefore, by using the Al-containing insulating film formed by the ALD method as the insulating film 16b, the pinhole formed in the insulating film 16a can be reliably filled with the insulating film 16b without any adverse influence from the film forming process of the insulating film 16b on the organic EL device. FIG. 18 is a partially enlarged cross-sectional view showing a part of the insulating films 16a and 16b in FIG. 10 (state in which the insulating film 16b is formed in the step S6b) in an enlarged manner, and the state in which the pinhole PH of the insulating film 16a is filled with the insulating film 16b by forming the insulating film 16b by the ALD method is shown schematically. By filling the pinhole PH, which has been formed in the insulating film 16a, with the insulating film 16b, it is possible to prevent the water intrusion to the organic EL device through the pinhole PH.

Figure 19:
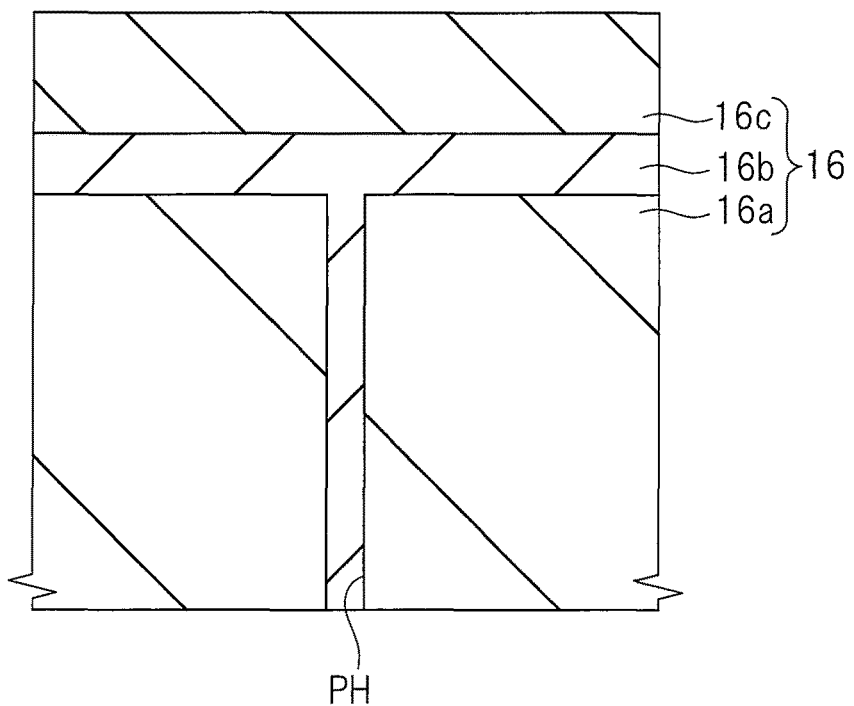
FIG. 19 is a partially enlarged cross-sectional view showing a part of FIG. 11 in an enlarged manner.

Furthermore, in the present embodiment, the insulating film 16c is formed over the insulating film 16b. The insulating film 16c is formed by the plasma CVD method. A Si-containing inorganic insulating film formed by the plasma CVD method is preferable as the insulating film 16c, and the film formation at a low temperature is possible and the film density can be increased by using the Si-containing inorganic insulating film, and it is thus possible to enhance the function of preventing the transmission of water of the insulating film 16c without any adverse influence from the film forming process of the insulating film 16c on the organic EL device. A silicon nitride film, a silicon oxide film or a silicon oxynitride film can be preferably used as the insulating film 16c, and a silicon nitride film is most preferable. This is because a finer film can be formed at a low temperature when a silicon nitride film is formed by the plasma CVD method. FIG. 19 is a partially enlarged cross-sectional view showing a part of the insulating films 16a, 16b and 16c in FIG. 11 (state in which the insulating film 16c is formed in the step S6c) in an enlarged manner, and the state in which the insulating film 16c is formed over the upper surface of the insulating film 16b is shown schematically.

Since the insulating film 16c with barrier properties to water is formed over the insulating film 16b, it is possible to prevent the insulating film 16b made of an Al-containing insulating film from coming in contact with water and reacting with the water. Namely, the pinhole formed in the insulating film 16a can be filled with the insulating film 16b by forming the insulating film 16b made of an Al-containing insulating film formed by the ALD method over the insulating film 16a formed by the plasma CVD method, and it is possible to prevent the insulating film 16b made of an Al-containing insulating film, which easily reacts with water, from reacting with water by forming the insulating film 16c over the insulating film 16b.

Furthermore, since the insulating film 16c is formed by the plasma CVD method, there is fear that a pinhole is formed in the insulating film 16c. However, the insulating film 16c has barrier properties to water except for the pinhole, and can prevent the transmission of water. In addition, the area of the pinhole formed in the insulating film 16c is minute with respect to the entire area of the insulating film 16c. Therefore, since the transmission of water to the insulating film 16b except for the transmission of water through the pinhole in the insulating film 16c can be prevented by forming the insulating film 16c over the insulating film 16b, it is possible to achieve the effect of preventing the insulating film 16b made of an Al-containing insulating film from coming in contact with water and reacting with the water by forming the insulating film 16c over the insulating film 16b.

Figure 20:
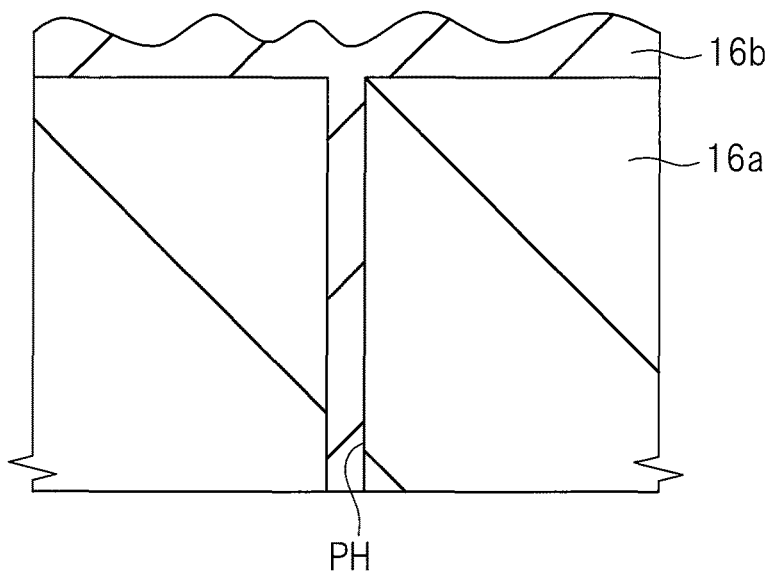
FIG. 20 is a cross-sectional view of a comparative example.

FIG. 20 is a cross-sectional view of a comparative example in which a display device is manufactured without forming the insulating film 16c over the insulating film 16b (corresponding to the case described in <Background of Examination> above) unlike the present embodiment, and the insulating film 16b in a state of being degraded by the reaction with water is shown schematically. If the insulating film 16c is not formed over the insulating film 16b, there is fear that the insulating film 16b is degraded by the reaction with water as schematically shown in FIG. 20. On the other hand, since the insulating film 16c with barrier properties to water is formed over the insulating film 16b in the present embodiment as shown in FIG. 19, it is possible to prevent the insulating film 16b from reacting with water and possible to prevent the degradation of the insulating film 16b due to the reaction with the water. In addition, since the insulating film 16c is made of a material less likely to react with water in comparison with the insulating film 16b, there is no fear that the insulating film 16c is degraded due to the reaction with water.

As described above, in the present embodiment, since the protection film 16 is made of the laminated film of the insulating film 16a, the insulating film 16b and the insulating film 16c, the insulating film 16a and the insulating film 16c have barrier properties to water and the insulating film 16b can fill the pinhole in the insulating film 16a, so that it is possible to prevent the insulating film 16b from coming in contact with water and reacting with the water by the insulating film 16c. Therefore, it is possible to enhance the function of preventing (blocking) the transmission of water of the protection film 16 and possible to enhance the effect of preventing the transmission of water to the organic EL device by the protection film 16. Accordingly, the performance of the protection film 16 for the organic EL device can be improved. As a result, the reliability of the organic EL device can be improved and the reliability of the display device using the organic EL device (organic EL display device) can be improved.

In the present embodiment, the protection film 16 is configured to have a three-layer structure in which the insulating film 16a, the insulating film 16b and the insulating film 16c are laminated, and this corresponds to the structure in which an Al-containing insulating film is inserted in the middle (middle in thickness) of a Si-containing inorganic insulating film formed by the plasma CVD method.

As described in <Background of Examination> above, a Si-containing inorganic insulating film formed by the plasma CVD method has barrier properties to water and it is desired to use it as a protection film. However, a pinhole is likely to be formed therein, and there is fear about the transmission of water through the pinhole. Meanwhile, in the case in which an Al-containing insulating film is formed by the ALD method over an upper surface of a Si-containing inorganic insulating film formed by the plasma CVD method and a protection film is formed of the two layers, there is fear that the Al-containing insulating film reacts with water. On the other hand, in the case in which an Al-containing insulating film formed by the ALD method is provided under a Si-containing inorganic insulating film formed by the plasma CVD method and a protection film is formed of the two layers, a pinhole formed in the Si-containing inorganic insulating film cannot be filled, and there is fear about the transmission of water through the pinhole.

In contrast, the structure of the protection film 16 of the present embodiment corresponds to the structure in which an Al-containing insulating film formed by the ALD method is inserted in the middle (middle in thickness) of a Si-containing inorganic insulating film formed by the plasma CVD method. Namely, the structure in which an Al-containing insulating film formed by the ALD method (16b) is sandwiched between Si-containing inorganic insulating films formed by the plasma CVD method (16a, 16c) is adopted. Accordingly, it is possible to fill the pinhole formed in the Si-containing inorganic insulating film on the lower side (16a) with the Al-containing insulating film (16b) and possible to suppress or prevent the Al-containing insulating film (16b) from reacting with water.

The other characteristics of the present embodiment will be further described below.

In the present embodiment, the protection film 16 is made of the laminated film of the insulating film 16a, the insulating film 16b and the insulating film 16c, and the thickness of each of the insulating films 16a, 16b and 16c is also devised. The specific description thereof will be given below.

Since inorganic insulating films are less likely to transmit water in comparison with organic insulating films, inorganic insulating films are suitable for the protection film of the organic EL device. Therefore, inorganic insulating films are used for the insulating films 16a, 16b and 16c constituting the protection film 16. However, since inorganic insulating films are harder than organic insulating films, cracks tend to be formed when the thickness thereof increases. Therefore, it is desired to suppress the occurrence of cracks in the protection film 16 by reducing the thickness of the protection film 16. In particular, when a flexible substrate with flexibility is used as the substrate 11, cracks tend to be formed in the protection film due to the stress caused by bending the substrate 11 in comparison with the case in which a hard substrate such as a glass substrate is used as the substrate 11. Therefore, particularly when a flexible substrate is used as the substrate 11, it is important to reduce the thickness of the protection film 16 so as to suppress the occurrence of cracks in the protection film 16.

Accordingly, it is desirable to suppress the thickness of the protection film 16 also in the present embodiment, but it is necessary to ensure the effect of preventing the water intrusion by the protection film 16 even when the thickness of the protection film 16 is suppressed.

Therefore, in the present embodiment, the protection film 16 is made of the laminated film of the insulating films 16a, 16b and 16c, and the thickness (film thickness) T1 of the insulating film 16a is made larger than each of the thickness (film thickness) T2 of the insulating film 16b and the thickness (film thickness) T3 of the insulating film 16c (namely, T1>T2 and T1>T3). In this manner, it is possible to efficiently ensure the effect of preventing the water intrusion by the protection film 16 even when the thickness of the protection film 16 is suppressed. The reason therefor will be described below.

Namely, the Si-containing inorganic insulating film has higher barrier properties to water and lower water permeability per unit thickness than those of the Al-containing insulating film. Therefore, the insulating films 16a and 16c have lower water permeability per unit thickness than that of the insulating film 16b. In addition, when the insulating film 16a is compared with the insulating film 16c, the pinhole of the insulating film 16a is filled with the insulating film 16b, while the pinhole of the insulating film 16c is not filled with the insulating film 16b. Accordingly, the insulating film 16a whose pinhole is filled with the insulating film 16b has lower water permeability per unit thickness than that of the insulating film 16c whose pinhole is not filled. Namely, the pinhole of the insulating film 16a does not function as a transmission path of water because it is filled with the insulating film 16b, while the pinhole of the insulating film 16c may function as a transmission path of water because it is not filled with the insulating film 16b, and thus the insulating film 16a has lower water permeability per unit thickness than that of the insulating film 16c. Accordingly, the insulating film 16a has the lowest water permeability per unit thickness among the insulating films 16a, 16b and 16c.

Thus, in in the present embodiment, the thickness of the protection film 16 to be assigned to the insulating film 16a is made larger than that to be assigned to each of the insulating film 16b and the insulating film 16c. Namely, the thickness T1 of the insulating film 16a is made larger than the thickness T2 of the insulating film 16b and is made larger than the thickness T3 of the insulating film 16c (that is, T1>T2 and T1>T3). The effect of preventing the water intrusion by the protection film 16 can be enhanced because the insulating film 16a with the lowest water permeability per unit thickness among the insulating films 16a, 16b and 16c is made thickest, and the overall thickness of the protection film 16 can be suppressed because the thicknesses of the insulating films 16b and 16c with higher water permeability per unit thickness than that of the insulating film 16a are reduced. Accordingly, it is possible to efficiently achieve the effect of preventing the water intrusion by the protection film 16 while suppressing the thickness of the protection film 16.

Namely, the case in which the thickness of the protection film 16 is fixed is assumed. In this case, if the insulating films 16b and 16c are made thick and the insulating film 16a is made thin by that much, the thickness of the insulating film 16a with the lowest water permeability per unit thickness is reduced, so that the overall water permeability of the protection film 16 is increased. On the other hand, if the insulating films 16b and 16c are made thin and the insulating film 16a is made thick by that much, the thickness of the insulating film 16a with the lowest water permeability per unit thickness is increased, so that the overall water permeability of the protection film 16 can be reduced. Accordingly, in order to efficiently enhance the effect of preventing the water intrusion by the protection film 16 without increasing the overall thickness of the protection film 16, it is effective to make the insulating films 16b and 16c thin and make the insulating film 16a thick by that much. For this reason, the thickness of the protection film 16 to be assigned to the insulating film 16a is made larger than that to be assigned to each of the insulating film 16b and the insulating film 16c so that the thicknesses T1, T2 and T3 of the insulating films 16a, 16b and 16c satisfy the relations of T1>T2 and T1>T3. It is more preferable when the relation of T1>T2+T3 (relation in which the thickness T1 of the insulating film 16a is larger than the total of the thicknesses T2 and T3 of the insulating films 16b and 16c) is satisfied.

In addition, the thickness of the protection film 16 to be assigned to the insulating film 16b is made smaller than the thickness to be assigned to the insulating film 16a (that is, the thickness T2 of the insulating film 16b is made smaller than the thickness T1 of the insulating film 16a), but there is fear that the pinhole formed in the insulating film 16a cannot be sufficiently filled with the insulating film 16b when the insulating film 16b with the thickness T2 is too thin. Therefore, the thickness T2 of the insulating film 16b formed in the step S6b is preferably 10 nm or larger (T2≥10 nm) and is more preferably 15 nm or larger (T2≥15 nm). In this manner, even if a pinhole is formed in the insulating film 16a when the insulating film 16a is formed by the plasma CVD method in the step S6a, the pinhole of the insulating film 16a can be appropriately filled with the insulating film 16b when the insulating film 16b is formed by the ALD method in the step S6b. Accordingly, the effect of preventing the water intrusion by the protection film 16 can be achieved more reliably.

In addition, since the water permeability per unit thickness of the insulating film 16b is higher in comparison with the insulating films 16a and 16c, it is advantageous that the thickness T2 of the insulating film 16b is not increased too much as long as the thickness capable of sufficiently filling the pinhole of the insulating film 16a can be ensured, from the viewpoint of suppressing the overall overall thickness of the protection film 16. Furthermore, since the film forming rate of the ALD method is low, it is advantageous that the thickness T2 of the insulating film 16b is not increased too much as long as the thickness capable of sufficiently filling the pinhole of the insulating film 16a can be ensured, from the viewpoint of shortening the manufacturing time to improve the throughput. From these viewpoints, the thickness T2 of the insulating film 16b formed in the step S6b is preferably 50 nm or smaller (T2≤50 nm). Therefore, the thickness T2 of the insulating film 16b is preferably 10 to 50 nm and is more preferably 15 to 50 nm.

In addition, since the insulating film 16a has the lower water permeability per unit thickness than that of the insulating film 16c, the effect of preventing the water intrusion by the protection film 16 can be enhanced when the insulating film 16a is made thicker than the insulating film 16c, but if the insulating film 16c with the thickness T3 is made too thin, there is fear that the effect of preventing the reaction between the insulating film 16b and the water by the insulating film 16c is degraded. Therefore, the thickness T3 of the insulating film 16c formed in the step S6c is preferably 10 nm or larger (T3≥10 nm) and is more preferably 15 nm or larger (T3≥15 nm). In this manner, it is possible to more reliably prevent the reaction between the insulating film 16b and the water by the insulating film 16c.

Figure 21:
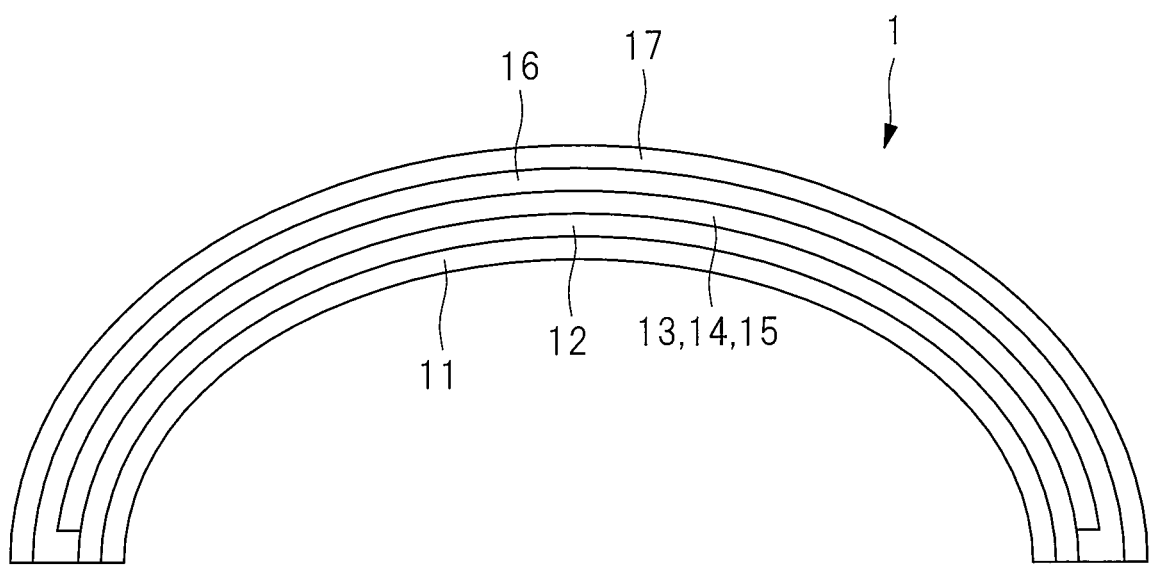
FIG. 21 is a cross-sectional view schematically showing a case in which a flexible substrate is used as a substrate of a display device and the flexible substrate (display device) is bent.

FIG. 21 is a cross-sectional view schematically showing a case in which a flexible substrate is used as the substrate 11 of the display device 1 and the flexible substrate (display device 1) is bent. Although FIG. 21 is a cross-sectional view, the hatching is omitted so as to make the drawing easy to see. When a flexible substrate is used as the substrate 11 of the display device 1, the display device 1 becomes bendable.

In the case in which a flexible substrate is used as the substrate 11, there is a risk that cracks occur in a protection film made of an inorganic insulating film due to the bending, and it is thus desirable that the protection film made of an inorganic insulating film is as thin as possible. Accordingly, in the case in which a flexible substrate is used as the substrate 11, the effect obtained by applying the present embodiment capable of efficiently preventing the water intrusion by the protection film 16 while suppressing the thickness of the protection film 16 is extremely great.

In addition, in the case in which a flexible substrate is used as the substrate 11, it is effective to reduce the thickness of the protection film 16 in order to prevent the occurrence of the cracks in the protection film 16 even when the flexible substrate (display device) is bent with a small bending radius, and it is particularly preferable when the thickness of the protection film 16 is 20 nm or smaller. However, there is fear that the reduction in thickness of the protection film leads to the increase of the risk of the water intrusion. In contrast, in the present embodiment, the effect of preventing the water intrusion by the protection film 16 can be efficiently achieved while suppressing the thickness of the protection film 16 by devising the thicknesses of the insulating films 16a, 16b and 16c in the above-described manner, and it is thus possible to reliably achieve the effect of preventing the water intrusion by the protection film 16 even when the thickness of the protection film 16 is 200 nm or smaller. Therefore, the thickness of the protection film 16 can be reduced while reliably achieving the effect of preventing the water intrusion by the protection film 16 by applying the present embodiment, and the thickness of the protection film 16 can be reduced to, for example, 200 nm or smaller. Consequently, it is possible to prevent the occurrence of the cracks in the protection film 16 even when the flexible substrate (display device) is bent with a small bending radius. Note that the protection film 16 with the thickness of 200 nm or smaller corresponds to that the total of the thickness T1 of the insulating films 16a, the thickness T2 of the insulating films 16b and the thickness T3 of the insulating films 16c is 200 nm or smaller (that is, T1+T2+T3≤200 nm).

In addition, in order to enhance the effect of preventing the water intrusion by the protection film 16, it is effective to increase the density of the insulating films 16a and 16c (in particular, insulating film 16a). The barrier properties to water of the insulating films 16a and 16c except for the pinhole can be enhanced by increasing the densities of the insulating films 16a and 16c. Therefore, it is more preferable to use the ICP-CVD method when the insulating film 16a is formed by the plasma CVD method in the step S6a. In addition, it is more preferable to use the ICP-CVD method when the insulating film 16c is formed by the plasma CVD method in the step S6c. The ICP-CVD method can easily increase the plasma density (plasma electron density) in comparison with the CCP-CVD method (Conductively Coupled Plasma CVD method) or the like, and can easily increase the density of the film to be formed while suppressing the film forming temperature. The densities of the insulating films 16a and 16c can be increased while suppressing the film-forming temperature by using the ICP-CVD method for the film forming process of the insulating films 16a and 16c, and it is possible to further enhance the effect of preventing the water intrusion by the protection film 16. Therefore, it is possible to further enhance the effect of preventing the water intrusion by the protection film 16 while suppressing the thickness of the protection film 16.

In addition, an inorganic insulating film is a film almost impermeable to water, but it is also a hard film. Therefore, it is also possible to form the resin film 17 over the protection film 16, that is, over the insulating film 16c. Also, the resin film 17 can also be used as a film of an uppermost layer of the display device 1. Since a resin film (17) is more permeable to water than an inorganic insulating film (16), the function as a film to prevent the water intrusion is small. However, a resin film (17) is softer than an inorganic insulating film (16). Accordingly, the formation of the soft resin film 17 over the protection film 16 makes the display device 1 easy to operate. In addition, the resin film 17 can function as a protection film from a physical impact (mechanical protection film). Furthermore, in the case in which a flexible substrate is used as the substrate 11, breakage of the protection film 16 due to the bending can be more reliably prevented by forming the resin film 17 over the protection film 16.

Also, in the case in which the resin film 17 is formed over the protection film 16, the film obtained by combining the protection film 16 and the resin film 17 can be regarded as the protection film. Namely, in the case in which the resin film 17 is formed, the laminated film of the insulating film 16a, the insulating film 16b, the insulating film 16c and the resin film 17 can be regarded as the protection film. However, in the case in which the resin film 17 is formed, it is the laminated body (laminated film) of the insulating film 16a, the insulating film 16b and the insulating film 16c that functions as a film to prevent the water intrusion (water prevention film), and the resin film 17 mainly functions as a mechanical protection film. The water protection film (here, protection film 16) is made of inorganic insulating films, and the mechanical protection film (here, resin film 17) is made of a resin material (organic insulator).

In addition, the case in which the resin film 17 is formed directly over the insulating film 16b without forming the insulating film 16c unlike the present embodiment is assumed. In this case, since a resin film is permeable to water, the water passing through the resin film 17 reaches the insulating film 16b even when the resin film 17 is formed over the insulating film 16b, and the water reacts with the insulating film 16b made of an Al-containing insulating film, with the result that the insulating film 16b is deteriorated.

In contrast, in the present embodiment, the insulating film 16c made of a Si-containing inorganic insulating film is used as a film formed over the insulating film 16b so as to be in contact with the insulating film 16b instead of a resin film. Since the insulating film 16c is less permeable to water than a resin film, it is possible to reliably prevent the reaction between the insulating film 16b made of an Al-containing insulating film with the water by forming the insulating film 16c directly over the insulating film 16b.

Figure 22:
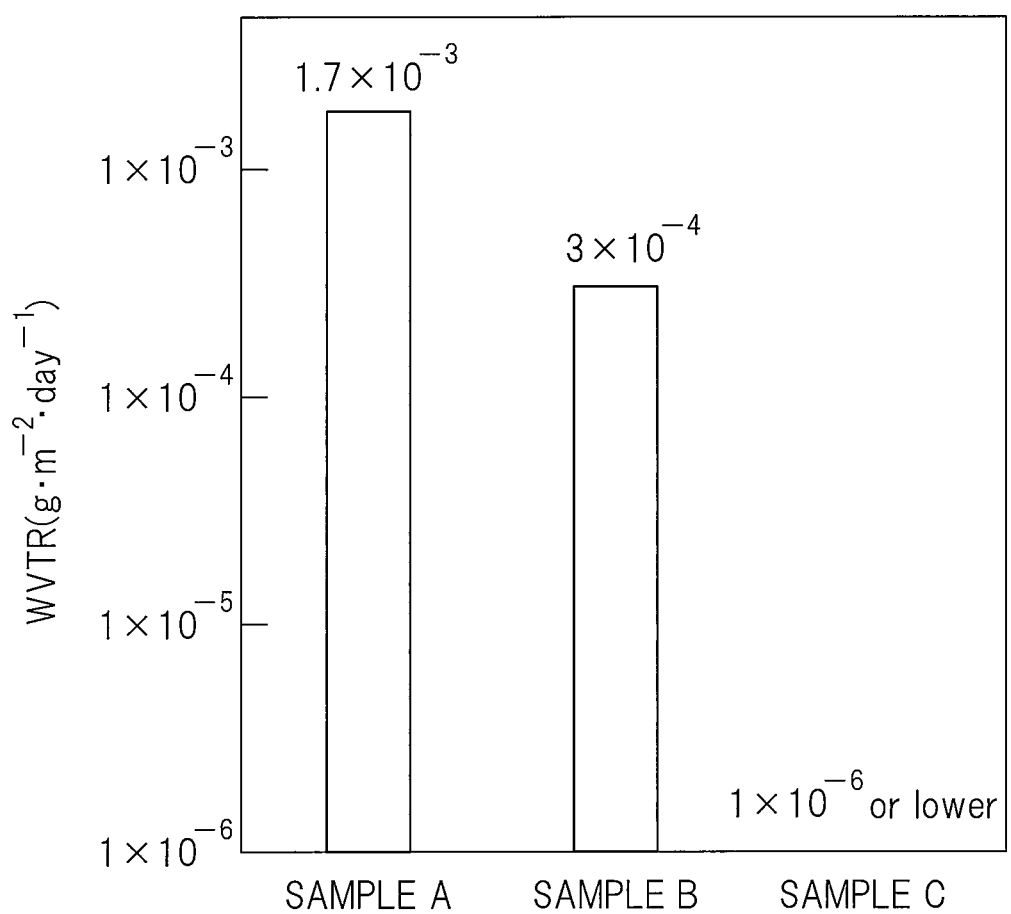
FIG. 22 is a graph showing a result of experiment about water permeability of protection films.

FIG. 22 is a graph showing a result of experiment about water permeability of protection films. FIG. 22 shows the result obtained by measuring the WVTR (Water Vapor Transmission Rate) by the Ca method (calcium method) with respect to a sample A, a sample B and a sample C.

The sample A corresponds to the case in which the protection film is formed of a single layer of a silicon nitride film formed by the plasma CVD method. The sample B corresponds to the case in which the protection film is formed of two layers of a silicon nitride film formed by the plasma CVD method and an aluminum oxide film formed thereon by the ALD method. The sample C corresponds to the case in which the protection film is formed of three layers of a silicon nitride film formed by the plasma CVD method, an aluminum oxide film formed thereon by the ALD method and a silicon nitride film formed thereon by the plasma CVD method. In each of the sample A, the sample B and the sample C, the protection film is formed over the substrate, and the WVTR of the protection film is measured by the Ca method. In addition, in each of the sample A, the sample B and the sample C, the protection film has the same thickness. Note that the sample A and the sample B correspond to the protection films described in <Background of Examination> above, and the sample C corresponds to the protection film 16 of the present embodiment.

As shown in the graph of FIG. 22, the WVTR (unit: $g \cdot m^{-2} \cdot day^{-1}$) is $1.7 \times 10^{-3}$ in the sample A and is $3 \times 10^{-4}$ in the sample B, while it is equal to or lower than the detection limit and is $1 \times 10^{-6}$ or lower in the sample C. It can be understood from these results that the water permeability of the protection film is extremely lower in the sample C in comparison with the sample A and the sample B. This indicates that the protection film of the sample C corresponding to the protection film 16 of the present embodiment is less permeable to water than the protection films of the sample A and the sample B, and the protection film of the sample C is exceptionally great as the protection film to prevent the water intrusion. In the present embodiment, it is possible to reliably prevent the transmission of water to the organic EL device by using the laminated film of the insulating film 16a, the insulating film 16b formed thereon and the insulating film 16c formed thereon as the water prevention film as described above.

In the foregoing, the invention made by the inventors of the present invention has been concretely described based on the embodiment. However, it is needless to say that the present invention is not limited to the foregoing embodiment and various modifications and alterations can be made within the scope of the present invention.

What is claimed is:

1. In a method of manufacturing a bendable electronic device having an organic EL device formed over a flexible substrate, the improvement comprising:
  forming an inorganic protection film for the organic EL device by a process including the steps of:
  (a) forming a first insulating film containing Si by a plasma CVD method so as to cover the organic EL device;
  (b) forming a second insulating film containing Al directly on the first insulating film by an ALD method; and
  (c) forming a third insulating film containing Si directly on the second insulating film by a plasma CVD method,
  wherein the inorganic protection film consists of the first insulating film as a lowermost layer, the second insulating film as an intermediate layer, and the third insulating film as an uppermost layer, and
  wherein a first thickness of the first insulating film formed by the plasma CVD method is larger than a sum of a second thickness of the second insulating film formed by the ALD method and a third thickness of the third insulating film formed by the plasma CVD method.

2. The method of claim 1,
  wherein the first insulating film is made of a silicon nitride film, a silicon oxide film or a silicon oxynitride film,
  the second insulating film is made of an aluminum oxide film, an aluminum nitride film or an aluminum oxynitride film, and
  the third insulating film is made of a silicon nitride film, a silicon oxide film or a silicon oxynitride film.

3. The method of claim 1,
wherein the first insulating film is made of a silicon nitride film,
the second insulating film is made of an aluminum oxide film or an aluminum oxynitride film, and
the third insulating film is made of a silicon nitride film.

4. The method of claim 1,
wherein the second thickness of the second insulating film is 10 nm or larger.

5. The method of claim 4,
wherein the third thickness of the third insulating film is 10 nm or larger.

6. The method of claim 1,
wherein an ICP-CVD method is used as the plasma CVD method in the step (a) and the step (c).

7. The method of claim 1, wherein the third thickness of the third insulating film formed by the plasma CVD method is greater than the second thickness of the second insulating film formed by the ALD method.

8. The method of claim 1, the improvement further comprising:
forming a resin film directly on the third insulating film.

9. In a method of manufacturing a bendable display device having an organic EL device formed over a flexible substrate, the improvement comprising:
forming an inorganic protection film for the organic EL device by a process including the steps of:
(a) forming a first insulating film containing Si by a plasma CVD method so as to cover the organic EL device;
(b) forming a second insulating film containing Al directly on the first insulating film by an ALD method; and
(c) forming a third insulating film containing Si directly on the second insulating film by a plasma CVD method,
wherein the inorganic protection film consists of the first insulating film as a lowermost layer, the second insulating film as an intermediate layer, and the third insulating film as an uppermost layer, and
wherein a first thickness of the first insulating film formed by the plasma CVD method is larger than a sum of a second thickness of the second insulating film formed by the ALD method and a third thickness of the third insulating film formed by the plasma CVD method.

10. The method of claim 9,
wherein the first insulating film is made of a silicon nitride film, a silicon oxide film or a silicon oxynitride film,
the second insulating film is made of an aluminum oxide film, an aluminum nitride film or an aluminum oxynitride film, and
the third insulating film is made of a silicon nitride film, a silicon oxide film or a silicon oxynitride film.

11. The method of claim 9,
wherein the first insulating film is made of a silicon nitride film,
the second insulating film is made of an aluminum oxide film or an aluminum oxynitride film, and
the third insulating film is made of a silicon nitride film.

12. The method of claim 9, the improvement further comprising:
forming a resin film directly on the third insulating film.

13. The method of claim 9,
wherein the second thickness of the second insulating film is 10 nm or larger.

14. The method of claim 13,
wherein the third thickness of the third insulating film is 10 nm or larger.

15. The method of claim 9,
wherein a total of the first thickness, the second thickness and the third thickness is 200 nm or smaller.

16. The method of claim 9,
wherein an ICP-CVD method is used as the plasma CVD method in the step (a) and the step (c).

17. The method of claim 9, wherein the third thickness of the third insulating film formed by the plasma CVD method is greater than the second thickness of the second insulating film formed by the ALD method.

18. In a bendable display device having an organic EL device formed over a flexible substrate, the improvement comprising:
an inorganic protection film for the organic EL device, the inorganic protection film consisting of:
a first insulating film formed as a lowermost layer so as to cover the organic EL device;
a second insulating film formed directly on the first insulating film as an intermediate layer; and
a third insulating film formed directly on the second insulating film as an uppermost layer,
wherein the first insulating film is made of a silicon nitride film, a silicon oxide film or a silicon oxynitride film formed by a plasma CVD method,
the second insulating film is made of an aluminum oxide film, an aluminum nitride film or an aluminum oxynitride film formed by an ALD method,
the third insulating film is made of a silicon nitride film, a silicon oxide film or a silicon oxynitride film formed by a plasma CVD method, and
a first thickness of the first insulating film is larger than a sum of a second thickness of the second insulating film and a third thickness of the third insulating film.

19. The flexible display device of claim 18, the improvement further comprising:
a resin film formed directly on the third insulating film.

20. The flexible display device of claim 18, wherein the third thickness of the third insulating film is greater than the second thickness of the second insulating film.

* * * * *